United States Patent
Shibuya

(10) Patent No.: US 7,120,180 B2
(45) Date of Patent: Oct. 10, 2006

(54) LASER DIODE DRIVING CIRCUIT AND AN OPTICAL HEAD

(75) Inventor: Giichi Shibuya, Tokyo (JP)

(73) Assignee: TDK Corporation, Tokyo (JP)

( * ) Notice: Subject to any disclaimer, the term of this patent is extended or adjusted under 35 U.S.C. 154(b) by 177 days.

(21) Appl. No.: 10/932,845

(22) Filed: Sep. 1, 2004

(65) Prior Publication Data

US 2005/0047457 A1    Mar. 3, 2005

(30) Foreign Application Priority Data

Sep. 3, 2003    (JP) .............................. 2003-311784

(51) Int. Cl.
  *H01S 3/00* (2006.01)
(52) U.S. Cl. ............... 372/38.1; 372/38.02; 372/38.03; 372/38.04; 372/38.07
(58) Field of Classification Search ... 372/38.01–38.07
  See application file for complete search history.

(56) References Cited

U.S. PATENT DOCUMENTS

| 4,359,773 | A | * | 11/1982 | Swartz et al. .................. 372/26 |
| 6,970,487 | B1 | * | 11/2005 | Shibuya .................... 372/38.02 |
| 2004/0032888 | A1 | * | 2/2004 | Ferstl ...................... 372/38.02 |

FOREIGN PATENT DOCUMENTS

| JP | 05-136501 | 6/1993 |
| JP | 05-175579 | 7/1993 |
| JP | 9-102663 | 4/1997 |
| JP | 11-214615 | 8/1999 |
| JP | 2003-188464 | 7/2003 |
| JP | 2003-317293 | 11/2003 |

* cited by examiner

*Primary Examiner*—Minsun Oh Harvey
*Assistant Examiner*—Delma R. Flores Ruiz
(74) *Attorney, Agent, or Firm*—Seed IP Law Group PLLC

(57) ABSTRACT

A laser diode driving circuit includes two chip capacitors disposed in the vicinity of one side portion of an IC along which a high voltage power supply terminal, a low voltage power supply terminal and a driving signal output terminal are disposed. One end portion of each of the chip capacitors is connected to the high voltage power supply terminal and the other end portion of each of the chip capacitors is connected to the low voltage power supply terminal. The chip capacitors are adapted for serving to reduce a ripple component superposed on a power supply voltage when a switching element is operated. The chip capacitors are disposed so that the distance between itself and the high voltage power supply terminal, the low voltage power supply terminal and the driving signal output terminal is equal to or shorter than 10 mm.

According to the thus constituted laser diode driving circuit, it is possible to generate a good driving signal even when the pulse width of pulsed light emitted from a laser diode is narrow.

16 Claims, 15 Drawing Sheets

TIME (2NS/DIV)

TIME (2NS/DIV)

TIME (2NS/DIV)

TIME (2NS/DIV)

LASER DIODE DRIVING CIRCUIT AND AN OPTICAL HEAD

BACKGROUND OF THE INVENTION

The present invention relates to a laser diode driving circuit for driving a laser diode and an optical head including a laser diode and a driving circuit therefor.

DESCRIPTION OF THE PRIOR ART

Recently, the amount of information handled in various situations has increased dramatically. Therefore, it has become necessary to increase the storage capacity and data transfer rate of recording systems for recording and reproducing information. In particular, it is very important to increase the recording velocity of an optical recording system used with optical recording media, such as optical recording disks having large storage capacity, to the same level as that of a magnetic disk apparatus. Therefore, optical recording media in which data can be recorded at a high recording velocity have been actively developed.

An optical recording system is normally constituted so that an optical recording medium is irradiated with light emitted from an optical head disposed so as to face the optical recording medium and information is optically recorded in the optical recording medium. In the optical head, a laser diode is normally employed as a light source. When information is to be recorded in the optical recording medium, the laser diode is driven by a laser diode driving circuit so as to emit pulsed light. The laser diode driving circuit is constituted so that a driving signal for controlling the timing of emitting light from the laser diode is generated as a rectangular wave by a switching element and the driving signal is supplied to the laser diode.

In order to further increase recording velocity in an optical recording system, it is necessary to increase the output of the laser diode and reduce the width of the pulse of light emitted from the laser diode. In order to reduce the width of the pulse of light emitted from the laser diode, it is important to shorten the length of the transmission line for transmitting the driving signal as much as possible, thereby preventing degradation of the driving signal in the transmission line. Therefore, it is common for the laser diode driving circuit to be constituted as an integrated circuit (hereinafter, sometimes referred to as "IC") that is installed in the optical head and used exclusively for driving the laser diode.

The IC for driving the laser diode includes a switching element which produces a ripple component that comes to be superposed on the power supply voltage. The ripple component superposed on the power supply voltage generates an undesired ripple component in the driving signal. Therefore, in order to reduce the ripple component superposed on the power supply voltage of the IC for driving the laser diode, it is normal to connect a capacitor having large capacitance between a power supply line and a ground line to be connected to the IC for driving the laser diode. Conventionally, particular attention has not been paid to the position where the capacitor is installed.

Even in the conventional laser diode driving circuit, it is possible to generate a driving signal for causing the laser diode to emit pulsed light having a desired pulse width. For example, in the case of recording information in a CD-RW, which is a data rewritable type optical recording medium, at the 4× speed thereof, the minimum pulse width of the pulsed light is about 29 ns and the conventional laser diode driving circuit can generate a driving signal for causing the laser diode to emit pulsed light having such a pulse width without any problem.

However, in order to further narrow the pulse width of the pulsed light and increase the recording velocity, it is necessary for the laser diode driving circuit to generate a driving signal that is a rectangular wave having a narrower pulse width.

On the other hand, the rise time of a waveform of a normally used driving signal, such as a rectangular wave signal generated by a TTL (transistor-transistor-logic circuit), is about 1 ns. However, in an actual electronic circuit, the rise portion of the waveform of a driving signal is rounded due to impedance mismatching between the input terminal and output terminal and the presence of floating impedance in the transmission line. This rounding of the waveform of the driving signal causes distortion in the waveform of the pulsed light emitted from the laser diode.

When the pulse width of the pulsed light is sufficiently wide, this distortion in the waveform of the pulsed light does not cause any particular problem in the operation of the optical recording system. However, when the pulse width of the pulsed light is narrow, the proportion of the distorted portion of the waveform in the entire pulsed light becomes large and when information is recorded in an optical recording medium using pulsed light in which the proportion of the distorted portion of the waveform is great, it is difficult to feed sufficient energy to the optical recording medium. As a result, information is not correctly written in the optical recording medium and, therefore, there arises a risk of reading error occurring when information is reproduced.

On the other hand, when the pulse width of the pulsed light becomes narrower than the conventional width, distortion may be caused not only in the rise portion of the waveform but also throughout the waveform.

FIG. 23 is a diagram showing the waveform of a laser beam where the clock frequency of the pulsed light is 25 MHz. As shown in FIG. 23, in the case where the clock frequency of the pulsed light is 25 MHz, a small mountain-like peak is generated behind the pulse. This peak is caused by a ripple component of the power supply voltage and, although not shown, such a peak cannot be seen when the clock frequency is lower than 25 MHz, for example, when it is 10 MHz.

On the other hand, FIG. 24 is a diagram showing the waveform of a laser beam where the clock frequency of the pulsed light is 50 MHz. As shown in FIG. 24, in the case where the clock frequency of the pulsed light is 50 MHz, the mountain-like peak behind the pulse becomes large, making it difficult to distinguish from the pulse, and, therefore, a rectangular wave having the desired waveform cannot be generated. In the case where information is recorded using this pulsed light, since it is impossible to form a record mark having ideal shape and size, jitter of the reproduced signal increases, and the block error rate increases.

Thus, in the conventional semiconductor driving circuit, when the pulse width of the pulsed light emitted from the laser diode becomes narrow, a good driving signal cannot be generated. This problem becomes particularly severe when the clock frequency of the pulsed light becomes higher than 50 MHz.

SUMMARY OF THE INVENTION

It is therefore an object of the present invention to provide a laser diode driving circuit which can generate a good driving signal even when the pulse width of pulsed light emitted from a laser diode is narrow, and an optical head including such a laser diode driving circuit and a laser diode.

The above and other objects of the present invention can be accomplished by a laser diode driving circuit comprising an integrated circuit for driving a laser diode, a capacitor disposed in the vicinity of the integrated circuit and a board on which the integrated circuit and the capacitor are mounted, the integrated circuit comprising a switching element for generating a driving signal for driving the laser diode, a high voltage power supply terminal and a low voltage power supply terminal for feeding a power supply voltage to the switching element and a driving signal output terminal for outputting a driving signal generated by the switching element to outside, the high voltage power supply terminal, the low voltage power supply terminal and the driving signal output terminal being disposed in line on one side of the integrated circuit, the board comprising a high voltage conductive section adapted for feeding a high voltage to the high voltage power supply terminal or connected to a ground level, a low voltage conductive section adapted for feeding a low voltage to the low voltage power supply terminal or connected to a ground level and a driving signal transmitting conductive section for connecting the driving signal output terminal and the laser diode and transmitting a driving signal to the laser diode, and the capacitor being connected to the high voltage power supply terminal at one terminal thereof and connected to the low voltage power supply terminal at the other terminal thereof, and being disposed so that a distance between it self and the high voltage power supply terminal, the low voltage power supply terminal and the driving signal output terminal is equal to or shorter than 10 mm.

In a preferred aspect of the resent invention, the capacitor includes two or more capacitor components whose capacitances are different from each other, each of the capacitor components is connected to the high voltage power supply terminal at one terminal thereof and connected to the low voltage power supply terminal at the other terminal thereof, and at least one capacitor component is disposed so that a distance between itself and the high voltage power supply terminal, the low voltage power supply terminal and the driving signal output terminal is equal to or shorter than 10 mm.

In a preferred aspect of the present invention, the capacitor is mounted on a surface of the board opposite to a surface on which the integrated circuit is mounted and connected to the integrated circuit via a through-hole formed in the board.

In a preferred aspect of the resent invention, the capacitor is disposed so that a distance between itself and the high voltage power supply terminal, the low voltage power supply terminal and the driving signal output terminal is equal to or shorter than 5 mm.

The above and other objects of the present invention can be also accomplished by an optical head comprising a laser diode driving circuit, a laser diode driven by the laser diode driving circuit and an optical system for projecting a laser beam emitted from the laser diode on an optical recording medium, the laser diode driving circuit comprising an integrated circuit for driving a laser diode, a capacitor disposed in the vicinity of the integrated circuit and a board on which the integrated circuit and the capacitor are mounted, the integrated circuit comprising a switching element for generating a driving signal for driving the laser diode, a high voltage power supply terminal and a low voltage power supply terminal for feeding a power supply voltage to the switching element and a driving signal output terminal for outputting a driving signal generated by the switching element to outside, the high voltage power supply terminal, the low voltage power supply terminal and the driving signal output terminal being disposed in line on one side of the integrated circuit, the board comprising a high voltage conductive section adapted for feeding a high voltage to the high voltage power supply terminal or connected to a ground level, a low voltage conductive section adapted for feeding a low voltage to the low voltage power supply terminal or connected to a ground level and a driving signal transmitting conductive section for connecting the driving signal output terminal and the laser diode and transmitting a driving signal to the laser diode, and the capacitor being connected to the high voltage power supply terminal at one terminal thereof and connected to the low voltage power supply terminal at the other terminal thereof, and being disposed so that a distance between itself and the high voltage power supply terminal, the low voltage power supply terminal and the driving signal output terminal is equal to or shorter than 10 mm.

In a preferred aspect of the resent invention, the capacitor includes two or more capacitor components whose capacitances are different from each other, each of the capacitor components is connected to the high voltage power supply terminal at one terminal thereof and connected to the low voltage power supply terminal at the other terminal thereof, and at least one capacitor component is disposed so that a distance between itself and the high voltage power supply terminal, the low voltage power supply terminal and the driving signal output terminal is equal to or shorter than 10 mm.

In a preferred aspect of the resent invention, the capacitor is mounted on a surface of the board opposite to a surface on which the integrated circuit is mounted and connected to the integrated circuit via a through-hole formed in the board.

In a preferred aspect of the resent invention, the capacitor is disposed so that a distance between itself and the high voltage power supply terminal, the low voltage power supply terminal and the driving signal output terminal is equal to or shorter than 5 mm.

The above and other objects and features of the present invention will become apparent from the following description made with reference to the accompanying drawings.

DESCRIPTION OF THE PREFERRED EMBODIMENTS

Figure 1:
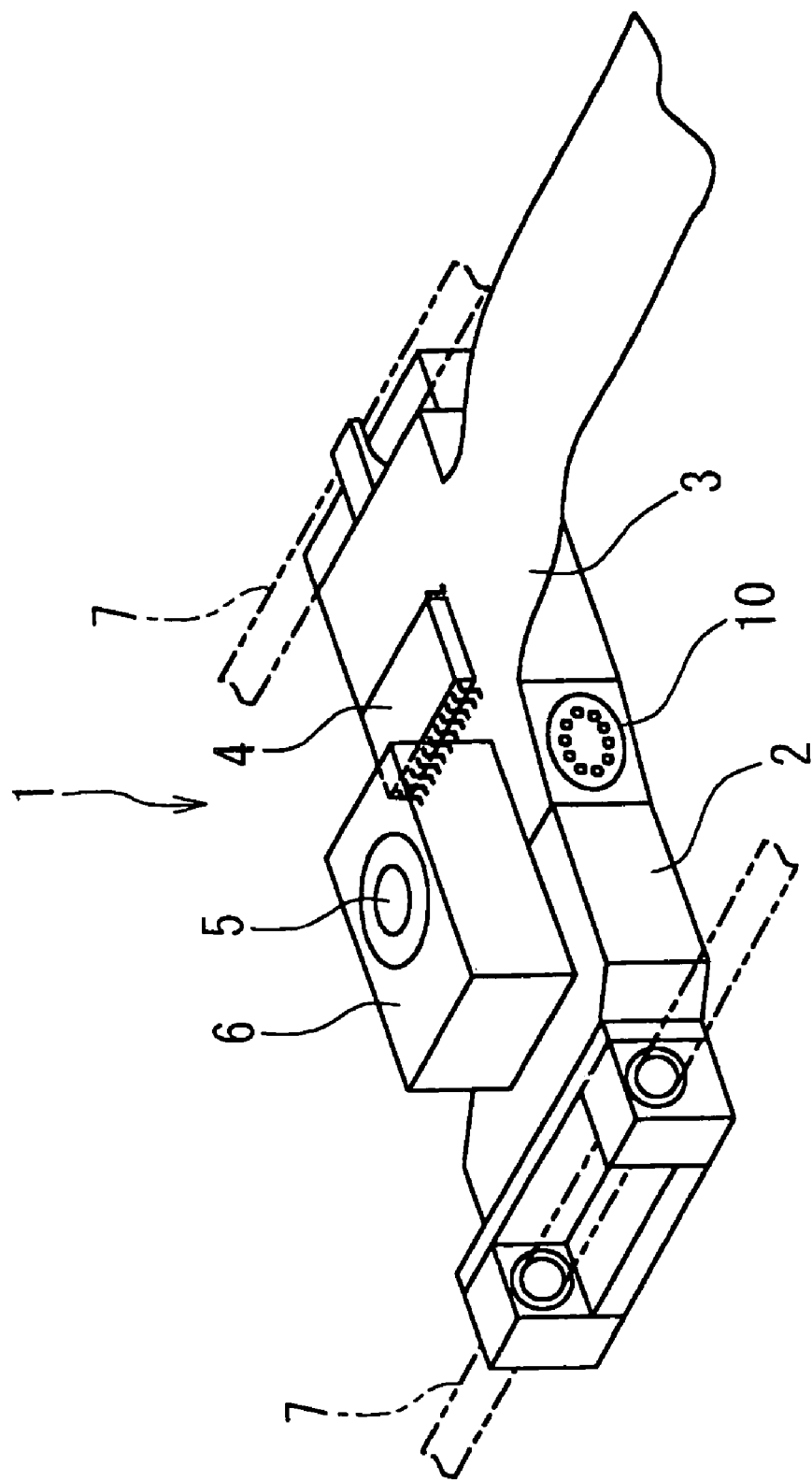
FIG. 1 is a schematic perspective view showing an optical head which is a preferred embodiment of the present invention.

FIG. 1 is a schematic perspective view showing an optical head which is a preferred embodiment of the present invention.

An optical head according to this embodiment is used in an optical recording and reproducing apparatus described later which is constituted so as to optically record information in an optical recording disk that is a disk-like optical recording medium and optically reproducing information from the optical recording disk.

The optical recording disk includes an information recording layer in which information is to be recorded and is formed with a plurality of tracks.

As shown in FIG. 1, the optical head 1 according to this embodiment includes a main optical head body 2 integrating a part of an optical head optical system described later, a first laser unit 10 secured to the main optical head body 2, a flexible circuit board 3 connected to the main optical head body 2, and an IC 4 mounted on the flexible circuit board 3 for driving a laser diode.

As shown in FIG. 1, the first laser unit 10 is connected to the flexible circuit board 3. The flexible circuit board 3 and the IC 4 for driving a laser diode constitute a laser diode driving circuit according to this embodiment.

The optical head optical system includes an objective lens 5. Although not shown in FIG. 1, the optical head 1 further includes an actuator for moving the objective lens 5 in a direction perpendicular to the surface of the optical recording disk and a direction across to the tracks. The actuator is fixed to the main optical head body 2. The optical head 1 further includes an actuator cover 6 for covering the actuator.

The first laser unit 10 includes a first laser diode and a first light detector described later. The IC 4 for driving a laser diode is constituted so as to drive the first laser diode.

Although not shown in FIG. 1, the optical head 1 further includes a second laser unit integrated with the main optical head body 2 and a high frequency wave superposing circuit connected to the second laser unit. The second laser unit includes a second laser diode and a second light detector.

As shown in FIG. 1, the main optical head body 2 is supported so as to be movable by rails disposed in parallel to each other in a direction across the tracks of the optical recording disk.

Figure 2:
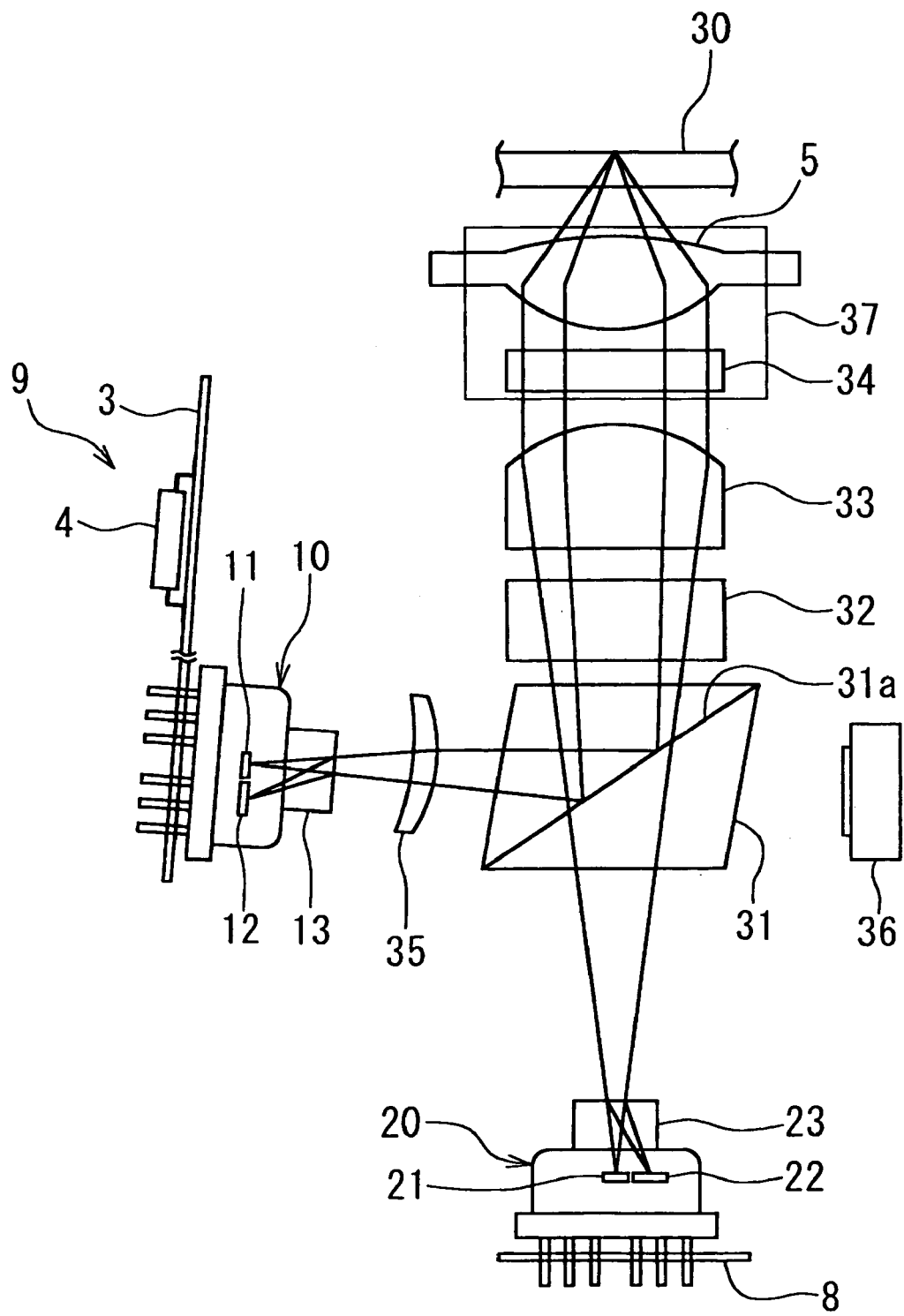
FIG. 2 is a diagram showing an optical system of an optical head which is a preferred embodiment of the present invention.

FIG. 2 is a diagram showing the optical system of the optical head 1.

As shown in FIG. 2, the optical head 1 is disposed so as to face the optical recording disk 30. As described above, the optical head 1 is provided with the first laser unit 10, the flexible circuit board 3 connected to the first laser unit 10, the IC 4 for driving a laser diode mounted on the flexible circuit board 3, the second laser unit 20 and a substrate 8. A high frequency wave superposing circuit described later is mounted on the substrate 8.

The first laser unit 10 includes a first laser diode 11 for emitting a laser beam having a first wavelength, a first light detector 12 and a first hologram 13. The first light detector 12 has tetrameric light detecting portions, for example, so that a reproduced signal, a focusing error signal and a tracking error signal can be generated. The first hologram 13 is adapted for allowing a laser beam emitted from the first laser diode 11 to pass therethrough and diffracting a part of light returned from the optical recording disk 30 to lead it to the first light detector 12.

The second laser unit 20 includes a second laser diode 21 for emitting a laser beam having a second wavelength different from the first wavelength, a second light detector 22 and a second hologram 23. The second light detector 22 has tetrameric light detecting portions, for example, so that a reproduced signal, a focusing error signal and a tracking error signal can be generated. The second hologram 23 is adapted for allowing a laser beam emitted from the second laser diode 21 to pass therethrough and diffracting a part of light returned from the optical recording disk 30 to lead it to the second light detector 22.

The optical system includes an objective lens 5 disposed so as to face the optical recording disk 30. The optical system further includes a dichroic prism 31, a mirror 32, a collimator lens 33 and a quarterwave plate 34. The dichroic prism 31 has a dichroic surface 31a.

The first laser unit 10 is disposed at a position where light reflected from the dichroic surface 31a among light returned from the optical recording disk 30 enters. The optical system further includes a correction plate 35 disposed between the first laser unit 10 and the dichroic prism 31 and a front monitoring light detector 36 disposed on the opposite side of the correction plate 35 with respect to the dichroic prism 31.

The optical head 1 includes an actuator 37 for integrally moving the objective lens 5 and the quarterwave plate 34 in a direction perpendicular to the surface of the optical recording disk 30 and a direction across the tracks.

The optical head 1 is used in an optical recording and reproducing apparatus which can use two kinds of optical recording disks 30 such as a combination of a CD (compact disk) and a DVD (digital video disk or digital versatile disk).

The first laser unit 10 is used for recording information in a first kind of the optical recording disk 30 and reproducing information from the first kind of the optical recording disk 30. The second laser unit 20 is used for recording information in a second kind of the optical recording disk 30 and reproducing information from the second kind of the optical recording disk 30.

When information is recorded in the first kind of the optical disk 30, the first laser diode 11 is driven by the IC for driving a semiconductor so that pulsed light for recording having high power is intermittently emitted from the first laser diode 11 of the first laser unit 10.

The pulsed light emitted from the first laser diode 11 passes through the first hologram 13 and the correction plate 35 and impinges on the dichroic prism 31, whereby the major part thereof is reflected by the dichroic surface 31a and the remaining part thereof passes through the dichroic surface 31a and enters the front monitoring light detector 36. An output signal of the front monitoring light detector 36 is used for automatically adjusting the amount of light emitted from the first laser diode 11.

Light reflected by the dichroic surface 31a passes through the mirror 32, the collimator lens 33, the quarterwave plate 34 and the objective lens 5 in this order and is condensed onto the optical recording disk 30, whereby information is optically recorded in an information recording layer of the optical recording disk 30.

A part of the light projected onto the optical recording disk 30 is reflected by the information recording layer and returned from the optical recording disk 30. This returned light passes through the objective lens 5, the quarterwave plate 34, the collimator lens 33 and the mirror 32 in this order and impinges on the dichroic prism 31, whereby the major part thereof is reflected by the dichroic surface 31a.

The returned light reflected by the dichroic surface 31a passes through the correction plate 35 and is diffracted by the first hologram 13 to enter the first light detector 12. A focusing error signal and a tracking error signal are generated based on the output of the first light detector 12.

When information is reproduced from the first kind of optical recording disk 30, the first laser diode 11 is driven by the IC for driving a semiconductor so that pulsed light for recording having low power is continuously emitted from the first laser diode 11 of the first laser unit 10.

The pulsed light emitted from the first laser diode 11 advances along the same path as that when information is recorded and is projected onto the optical recording disk 30. A part of the light projected onto the optical recording disk 30 is reflected by the information recording layer of the optical recording disk 30 and returned as light carrying information from the optical recording disk 30. This returned light enters the first light detector 12 along the same path as that when information is recorded and a reproduced signal, a focusing error signal and a tracking error signal are generated based on the output of the first light detector 12.

When information is recorded in the second kind of optical disk 30, the second laser diode 21 is driven by a recording signal supplied from the outside of the optical head 1 so that pulsed light for recording having high power is intermittently emitted from the second laser diode 21 of the second laser unit 20.

The pulsed light emitted from the second laser diode 21 passes through the second hologram 23 and impinges on the dichroic prism 31, whereby the major part thereof passes through the dichroic surface 31a and the remaining part thereof is reflected by the dichroic surface 31a and enters the front monitoring light detector 36. An output signal of the front monitoring light detector 36 is used for automatically adjusting the amount of light emitted from the second laser diode 21.

Light passing through the dichroic surface 31a passes through the mirror 32, the collimator lens 33, the quarterwave plate 34 and the objective lens 5 in this order and is condensed onto the optical recording disk 30, whereby information is optically recorded in an information recording layer of the optical recording disk 30.

A part of the light projected onto the optical recording disk 30 is reflected by the information recording layer and returned from the optical recording disk 30. This returned light passes through the objective lens 5, the quarterwave plate 34, the collimator lens 33 and the mirror 32 in this order and impinges on the dichroic prism 31, whereby the major part thereof passes through the dichroic surface 31a.

The returned light passing through the dichroic surface 31a is diffracted by the second hologram 23 to enter the second light detector 22. A focusing error signal and a tracking error signal are generated based on the output of the first light detector 22.

When information is reproduced from the second kind of the optical recording disk 30, a driving current is generated by superposing a high frequency wave signal generated by the high frequency wave superposing circuit on a current having a predetermined level and supplied from the outside of the optical head 1 and the second laser diode 21 is driven by the thus generated driving current.

The light emitted from the second laser diode 21 advances along the same path as that when information is recorded and is projected onto the optical recording disk 30. A part of the light projected onto the optical recording disk 30 is reflected by the information recording layer of the optical recording disk 30 and returned as light carrying information from the optical recording disk 30. This returned light enters the second light detector 22 along the same path as that when information is recorded and a reproduced signal, a focusing error signal and a tracking error signal are generated based on the output of the second light detector 22.

Next, referring to FIGS. 3 to 5, a laser diode driving circuit which is a preferred embodiment of the present invention will be described in detail.

Figure 3:
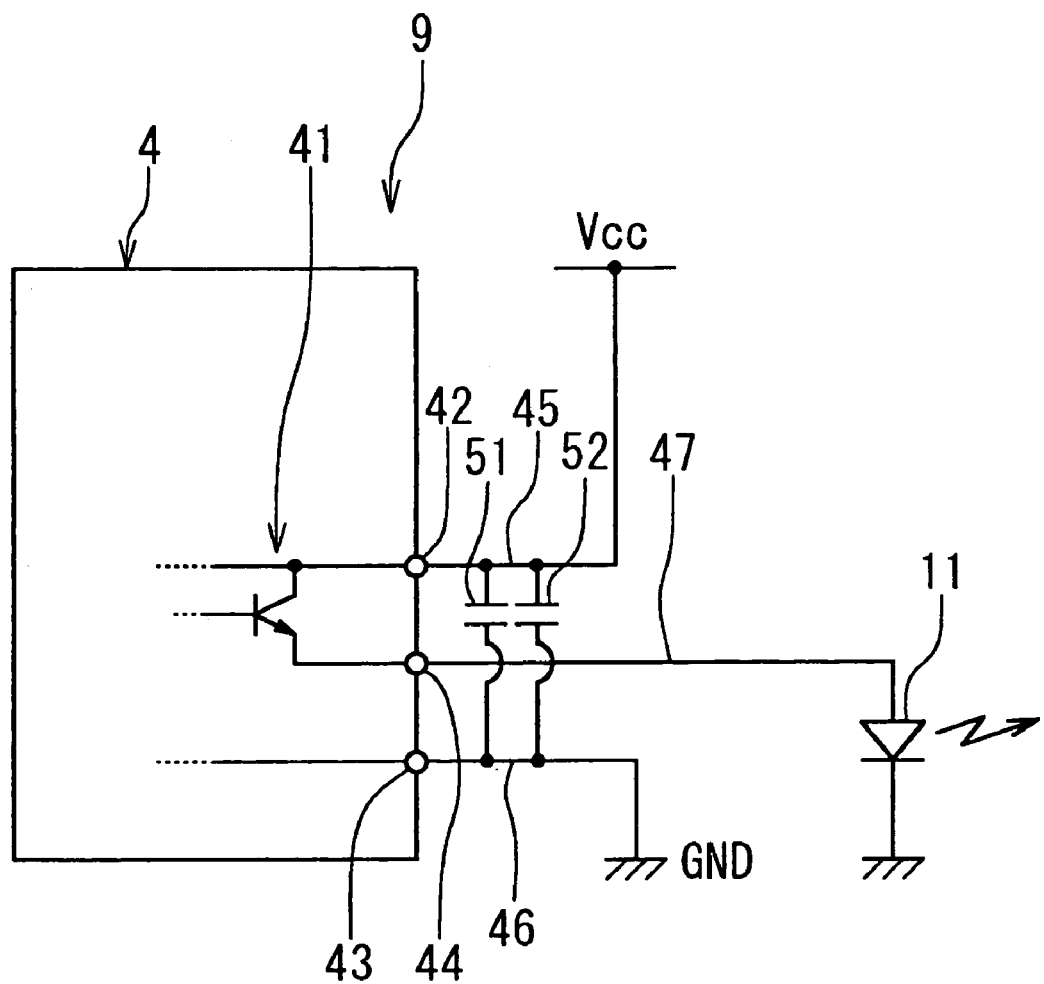
FIG. 3 is a circuit diagram of a laser diode driving circuit which is a preferred embodiment of the present invention.
Figure 4:
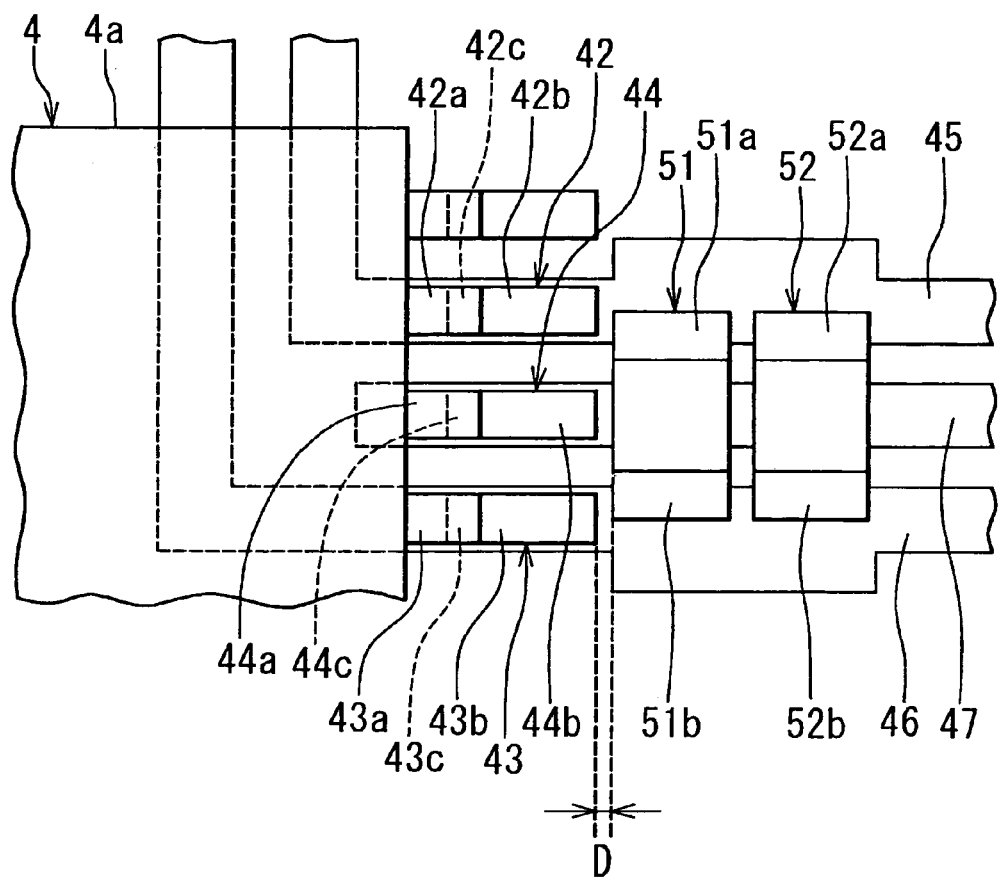
FIG. 4 is a schematic plan view showing a part of an IC for driving a laser diode and details in the vicinity thereof of a laser diode driving circuit which is a preferred embodiment of the present invention.
Figure 5:
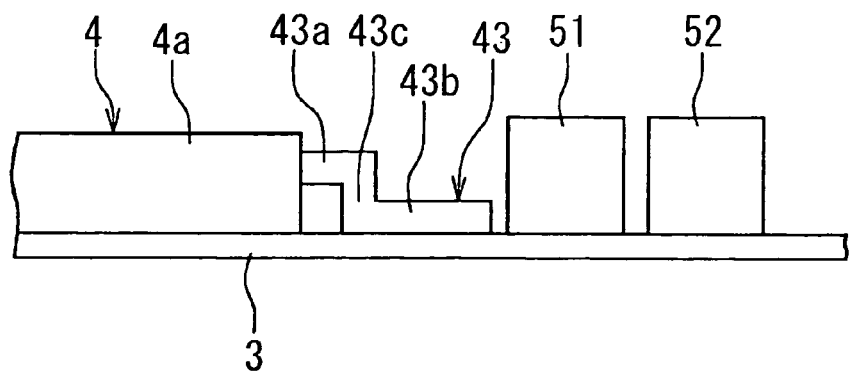
FIG. 5 is a schematic side view showing a part of an IC for driving a laser diode and details in the vicinity thereof of a laser diode driving circuit which is a preferred embodiment of the present invention.

FIG. 3 is a circuit diagram of a laser diode driving circuit which is a preferred embodiment of the present invention, FIG. 4 is a schematic plan view showing a part of an IC for driving a laser diode and details in the vicinity thereof of a laser diode driving circuit which is a preferred embodiment of the present invention and FIG. 5 is a schematic side view showing a part of an IC for driving a laser diode and details in the vicinity thereof of a laser diode driving circuit which is a preferred embodiment of the present invention. Here, FIG. 5 is a view showing the IC for driving a laser diode of FIG. 4 viewed from the lower side.

The laser diode driving circuit 9 according to this embodiment includes the IC 4 for driving a laser diode and the flexible circuit board 3 on which the IC 4 is mounted.

The IC 4 for driving a laser diode includes a main body 4a and a switching element 41 provided in the main body 4a and adapted for generating a driving signal for driving the first laser diode 11. The IC 4 further includes a high voltage power supply terminal 42 and a low voltage power supply terminal 43 each for feeding a power supply voltage to the switching element 41, and a driving signal output terminal 44 for outputting a driving signal generated by the switching element 41 to the outside.

Each of the high voltage power supply terminal 42, the low voltage power supply terminal 43 and the driving signal output terminal 44 is provided so as to project from one side portion of the main body 4a of the IC 4 to the outside. Each of the high voltage power supply terminal 42, the low voltage power supply terminal 43 and the driving signal output terminal 44 includes a main body connecting portion 42a, 43a or 44a horizontally extending from one side portion of the main body 4a of the IC 4 to the outside, a board connecting portion 42b, 43b or 44b connected to the flexible circuit board 3 and a connecting portion 42c, 43c or 44c for connecting the main body connecting portion 42a, 43a or 44a and the board connecting portion 42b, 43b or 44b.

As a switching element 41, for example, an NPN bipolar transistor shown in FIG. 3 can be used. In such a case, the collector of the transistor is connected to the high voltage power supply terminal 42 and the emitter of the transistor is connected to the driving signal output terminal 44. A voltage corresponding to a recording signal supplied from the outside of the optical head 1 is applied to the base of the transistor. The low voltage power supply terminal 43 is connected to a ground line in the IC 4.

As a switching element 41, a field effect type transistor may be used. In such a case, the drain of the transistor is connected to the high voltage power supply terminal 42 and the source of the transistor is connected to the driving signal output terminal 44. A voltage corresponding to a recording signal supplied from the outside of the optical head 1 is applied to the gate of the transistor.

As shown in FIG. 4, the high voltage power supply terminal 42, the low voltage power supply terminal 43 and the driving signal output terminal 44 are disposed in line along one side portion of the IC 4. In this embodiment, the driving signal output terminal 44 is disposed between the high voltage power supply terminal 42 and the low voltage power supply terminal 43.

The flexible circuit board 3 includes a high voltage conductive section 45 connected to the high voltage power supply terminal 42 and adapted for feeding a high voltage to the high voltage power supply terminal 42 or connected to a ground level, a low voltage conductive section 46 connected to the low voltage power supply terminal 43 and adapted for feeding a low voltage to the low voltage power supply terminal or connected to a ground level, and a driving signal transmitting conductive section 47 for connecting the driving signal output terminal 44 and the first laser diode 11 and transmitting a driving signal to the first laser diode 11. The high voltage conductive section 45, the low voltage conductive section 46 and the driving signal transmitting conductive section 47 are formed stripe-like. The voltages between the high voltage conductive section 45 and the low voltage conductive section 46 are relatively different and when the high voltage conductive section 45 is connected to ground, a negative potential may be applied to the low voltage conductive section 46, for example.

The laser diode driving circuit 9 includes two chip capacitors 51, 52 disposed in the vicinity of the one side portion of the IC 4 along which the high voltage power supply terminal 42, the low voltage power supply terminal 43 and the driving signal output terminal 44 are disposed. One end portion of each of the chip capacitors 51, 52 is connected to the high voltage power supply terminal 42 and the other end portion of each of the chip capacitors 51, 52 is connected to the low voltage power supply terminal 43. The chip capacitors 51, 52 serve to reduce a ripple component superposed on a power supply voltage when the switching element 41 is operated. The capacitances of the chip capacitors 51, 52 are different from each other. For example, the capacitance of the tip capacitor 51 is 10 µF and the capacitance of the tip capacitor 52 is 0.1 µF. Here, although the chip capacitor 51 is disposed closer to the high voltage power supply terminal 42, the low voltage power supply terminal 43 and the driving signal output terminal 44 than the tip capacitor 52 in FIGS. 4 and 5, the chip capacitors 51, 52 may be disposed reversely.

Opposite end portions of the chip capacitor 51 is formed with terminal portions 51a, 51b formed of a conductive material. The surface of the chip capacitor 51 between the terminal portions 51a, 51b is formed of an insulating material. Similarly, opposite end portions of the chip capacitor 52 is formed with terminal portions 52a, 52b formed of a conductive material. The surface of the chip capacitor 52 between the terminal portions 52a, 52b is formed of an insulating material.

Each of the chip capacitors 51, 52 is disposed over the driving signal transmitting conductive section 47, each of the terminal portions 51a, 52a is connected to the high voltage conductive section 45 and each of the terminal portions 51b, 52b is connected to the low voltage conductive section 46. The connection between each of the terminal portions 51a, 52a and the high voltage conductive section 45 and the connection between each of the terminal portions 51b, 52b and the low voltage conductive section 46 can be established by solder, for example. In this manner, the terminal portions 51a, 52a of the chip capacitors 51, 52 are connected to the high voltage power supply terminal 42 of the IC 4 via the high voltage conductive section 45 and the terminal portions 51b, 52b of the chip capacitors 51, 52 are connected to the low voltage power supply terminal 43 of the IC 4 via the low voltage conductive section 46. The chip capacitors 51, 52 are connected in parallel with each other.

As shown in FIG. 4, the widths of the portions of the high voltage conductive section 45 to which the terminal portions 51a, 52a of the chip capacitors 51, 52 are connected are larger than those of other portions of the high voltage conductive section 45. Similarly, the widths of the portions of the low voltage conductive section 46 to which the terminal portions 51b, 52b of the chip capacitors 51, 52 are connected are larger than those of other portions of the low voltage conductive section 46.

As shown in FIG. 3, a high voltage Vcc is applied to the high voltage conductive section 45 and a low voltage (ground level potential) GND is applied to the low voltage conductive section 46.

The distance D between the chip capacitor 51 disposed in the vicinity of the high voltage power supply terminal 42 and each of the driving signal output terminal 44, the high voltage power supply terminal 42, the low voltage power supply terminal 43 and the driving signal output terminal 44 is preferably equal to or shorter than 10 mm, more preferably equal to or shorter than 5 mm and particularly preferably equal to or shorter than 2 mm. In the case where the distance D is equal to or shorter than 10 mm, when the clock frequency of pulsed light is 50 MHz, pulsed light having an ideal waveform free from a ripple component can be generated. In particular, in the case where the distance D is equal to or shorter than 5 mm, pulsed light having an ideal waveform free from a ripple component can be generated not only when the clock frequency of pulsed light is 50 MHz but also when it is 25 MHz. Furthermore, in the case where the distance D is equal to or shorter than 2 mm, pulsed light having an ideal waveform free from a ripple component can be generated even when the clock frequency of pulsed light is 250 MHz.

Next, the operation of the laser diode driving circuit 9 will be described.

To the IC 4, a high voltage Vcc is applied via the high voltage conductive section 45 and the high voltage power supply terminal 42, and a low voltage GND is applied via the low voltage conductive section 46 and the low voltage power supply terminal 43. The difference in the voltages between the high voltage Vcc and the low voltage GND is a power supply voltage for driving the IC 4.

The switching element 41 generates a driving signal for driving the first laser diode 11. The driving signal is fed to the first laser diode 11 via the driving signal output terminal 44 and the driving signal transmitting conductive section 47.

The chip capacitors 51, 52 reduce a ripple component superposed on a power supply voltage when the switching element 41 is operated.

In this embodiment, the high voltage power supply terminal 42, the low voltage power supply terminal 43 and the driving signal output terminal 44 of the IC 4 are disposed in line along one side portion of the IC 4. In such a case, the switching element 41 in the IC 4 is disposed in the vicinity of the high voltage power supply terminal 42, the low voltage power supply terminal 43 and the driving signal output terminal 44.

In this embodiment, the chip capacitors 51, 52 are disposed in the vicinity of the one side portion of the IC 4 so that one end portion thereof is connected to the high voltage power supply terminal 42 and the other end portion thereof is connected to the low voltage power supply terminal 43. Thus, the chip capacitors 51, 52 are disposed in the vicinity of the switching element 41 in the IC 4. Therefore, according to this embodiment, the length of a wire causing generation of a high frequency wave signal component (a ripple component) between the high voltage conductive section 45 and the low voltage conductive section 46 can be shortened. Thereby, the delay or advance of a phase between voltages caused by inductive and capacitive floating reactance which the wire inherently has can be suppressed to the minimum. As a result, according to this embodiment, a ripple component superposed on a power supply voltage can be removed by the chip capacitors 51, 52 so as to prevent any rounding from being generated in the waveform of a driving signal. Therefore, according to this embodiment, it is possible to prevent a ripple component from being superposed on a driving signal and rounding from being generated in the waveform of a driving signal and as a result, a driving signal having an ideal waveform can be generated even in a region of high frequency.

As described above, according to this embodiment, a good driving signal can be generated by the laser diode driving circuit 9 even in the case where the pulse width of pulsed light emitted from the first laser diode 11 is particularly narrow and as a result, pulsed light having an ideal waveform can be generated even in a region of high frequency.

The shorter the distance D between the chip capacitor 51 and each of the high voltage power supply terminal 42, the low voltage power supply terminal 43 and the driving signal output terminal 44 is, the shorter can be made the length of a wire causing generation of a high frequency wave signal component (a ripple component) between the high voltage conductive section 45 and the low voltage conductive section 46. Concretely, the distance D is preferably equal to or shorter than 10 mm, more preferably equal to or shorter than 5 mm and particularly preferably equal to or shorter than 2 mm.

In the case where a plurality of chip capacitors are provided, the distance D is defined as that between the IC 4 and the chip capacitor closest to the IC 4. Strictly speaking, the distance between the switching element 41 in the IC 4 for driving a laser diode and a chip capacitor is critical. However, in general, since this distance is accurately determined and can be considered to be about 3 mm, in this embodiment, pulsed light having an ideal waveform is generated by determining the distance D between the chip capacitor 51 and each of the high voltage power supply terminal 42, the low voltage power supply terminal 43 and the driving signal output terminal 44 in the above described manner.

Further, in this embodiment, the two chip capacitors 51, 52 having different capacitances from each other and connected in parallel with each other are provided. Although the sizes of the two chip capacitors 51, 52 are the same in Figures, a chip capacitor having large capacitance is generally larger. The ability of the chip capacitor 51 of larger capacitance to prevent rounding from being generated in the waveform of a driving signal is excellent in comparison with that the chip capacitor 52 of smaller capacitance. Therefore, it is preferable to dispose the chip capacitor 51 close to the IC 4 in order to prevent rounding from being generated in the waveform of the driving signal. On the other hand, the ability of the chip capacitor 52 of smaller capacitance to remove a ripple component is excellent in comparison with that the chip capacitor 51 of larger capacitance. Therefore, it is possible to effectively prevent rounding from being generated in the waveform of a driving signal and remove a ripple component superposed on a driving signal by using these two chip capacitors 51, 52 together.

In this embodiment, it is not absolutely necessary to dispose the chip capacitors 51, 52 in line in the horizontal direction and it is possible to dispose them so as to be superposed.

Further, in this embodiment, it is not absolutely necessary to provide two chip capacitors 51, 52 and it is possible to provide a single chip capacitor or three or more chip capacitors.

Next, one example of an optical recording and reproducing apparatus including the optical head according to this embodiment will be described.

Figure 6:
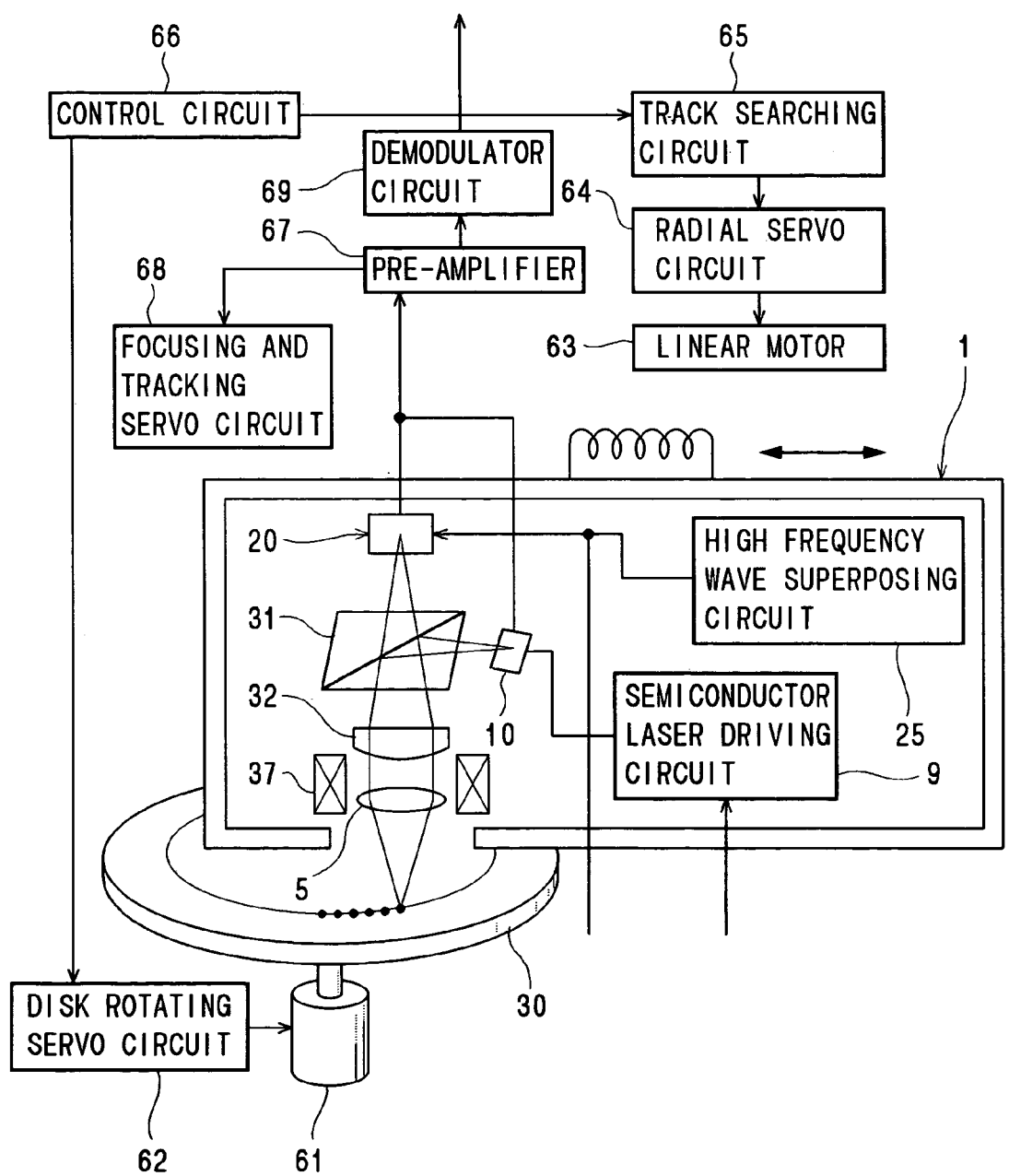
FIG. 6 is a diagram showing an optical recording and reproducing apparatus including an optical head which is a preferred embodiment of the present invention.

The optical recording and reproducing apparatus shown in FIG. 6 includes the optical head 1 shown in FIGS. 1 and 2, a motor 61 for rotating an optical recording disk 30 and a disk rotating servo circuit 62 for controlling the motor 61 so that the optical recording disk 30 is rotated at a predetermined speed.

As shown in FIG. 6, the optical head 1 further includes a high frequency wave superposing circuit 25 connected to the second laser unit 20. When information is to be recorded, a recording signal is applied to the second laser unit 20 form the outside of the optical head 1. Further, when information is to be reproduced, a driving current generated by superposing a high frequency wave signal generated by the high frequency wave superposing circuit 25 on a current having a predetermined level and supplied from the outside of the optical head 1 is applied to the second laser unit 20.

As shown in FIG. 6, the optical recording and reproducing apparatus further includes a linear motor 63 for moving the optical head 1 in a direction across the tracks of the optical recording disk 30, a radial servo circuit 64 for controlling the linear motor 63, a track searching circuit 65 for sending instructions to the radial servo circuit 64 so that the position irradiated with light emitted from the optical head 1 is moved to a desired track and a control circuit 66 for controlling the disk rotating servo circuit 62 and the track searching circuit 65.

As shown in FIG. 6, the optical recording and reproducing apparatus further includes a pre-amplifier 67 for amplifying an output signal from the first light detector 12 of the first laser unit 10 and an output signal from the second light detector 22 of the second laser unit 20, and a focusing and tracking servo circuit 68 and a demodulator circuit 69 each adapted for receiving an output signal from the pre-amplifier 67.

The focusing and tracking servo circuit 68 generates a focusing error signal and a tracking error signal based on output signals from the pre-amplifier 67 and controls the actuator 37 based on the thus generated focusing error signal and tracking error signal, thereby effecting focusing servo and tracking servo. The demodulator circuit 69 generates a reproduced signal based on an output signal from the pre-amplifier 67.

Figure 7:
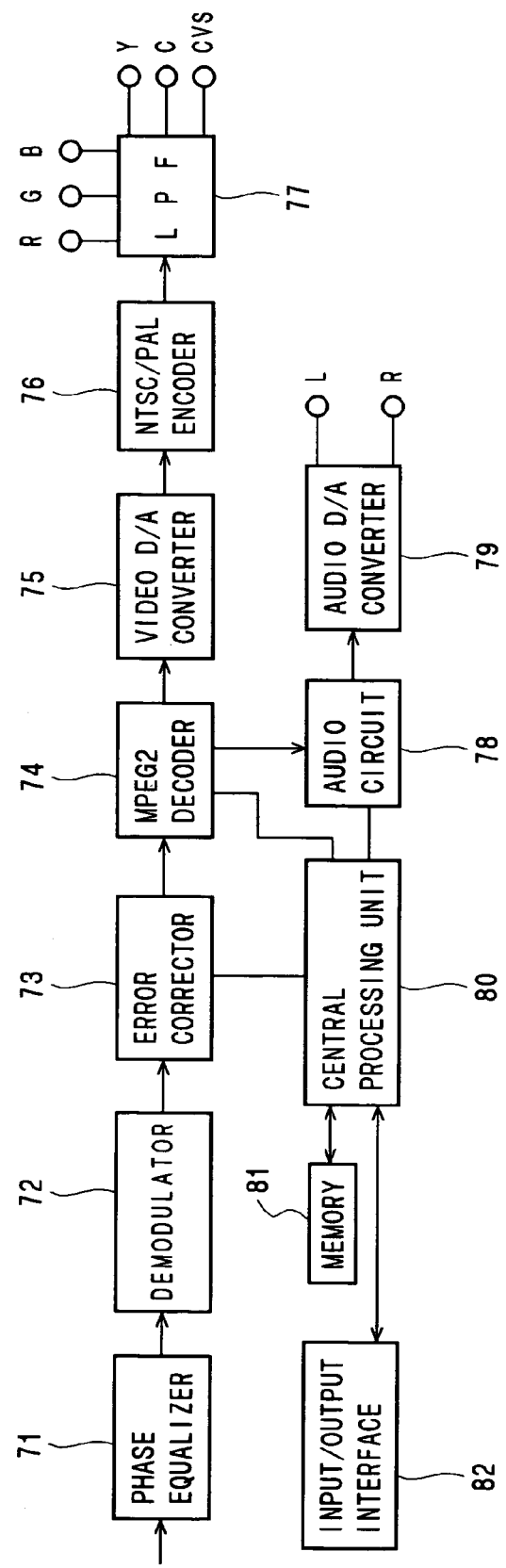
FIG. 7 is a block diagram of a reproduced signal processing circuit of an optical recording and reproducing apparatus including an optical head which is a preferred embodiment of the present invention.

FIG. 7 is a block diagram of a reproduced signal processing circuit of the optical recording and reproducing apparatus. In FIG. 7, the reproduced signal processing circuit is constituted so as to process only a signal reproduced from one of the optical recording disk 30 among the two kinds of optical recording disks 30 whose information can be read by the optical head 1.

As shown in FIG. 7, the reproduced signal processing circuit includes a phase equalizer 71 for receiving an output signal from the demodulator circuit 69 and compensating phase distortion of this signal, a demodulator 72 for selecting a modulation signal from among output signals from the phase equalizer 71, and an error corrector 73 for effecting error correction on the output signal from the demodulator 72.

As shown in FIG. 7, the reproduced signal processing circuit further includes an MPEG2 decoder 74 for converting an output signal from the error corrector 73 into video data or audio data of MPEG2 standard, a video D/A converter 75 for digital-to-analog converting video data output from the MPEG2 decoder 74, an NTSC/PAL encoder 76 for generating a composite video signal of an NTSC code or a PAL code from an output signal from the video D/A converter 75, and a low-pass filter 77 for removing a high frequency wave component from an output signal from the NTSC/PAL encoder 76 and outputting various video signals. For example, the low-pass filter 77 is adapted for outputting an RBG signal, a luminance signal (Y), a color signal (C) and a composite video signal (CVS).

As shown in FIG. 7, the reproduced signal processing circuit further includes an audio circuit 78 for processing audio data output from the MPEG2 decoder 74 and an audio D/A converter 79 for digital-to-analog converting output data from the audio circuit 78 and outputting an audio signal (L, R).

As shown in FIG. 7, the reproduced signal processing circuit further includes a central processing unit (CPU) 80 for controlling the error corrector 73, the MPEG2 decoder 74, the audio circuit 78 and the like, a memory 81 connected to the central processing unit 80, and an input/output interface 82 connected to the central processing unit 80. The input/output interface 82 is constituted so as to control input and output of signals between a remote control apparatus and the central processing unit 80, for example.

Next, a laser diode driving circuit and an optical head which are further preferred embodiments of the present invention will be described later.

Figure 8:
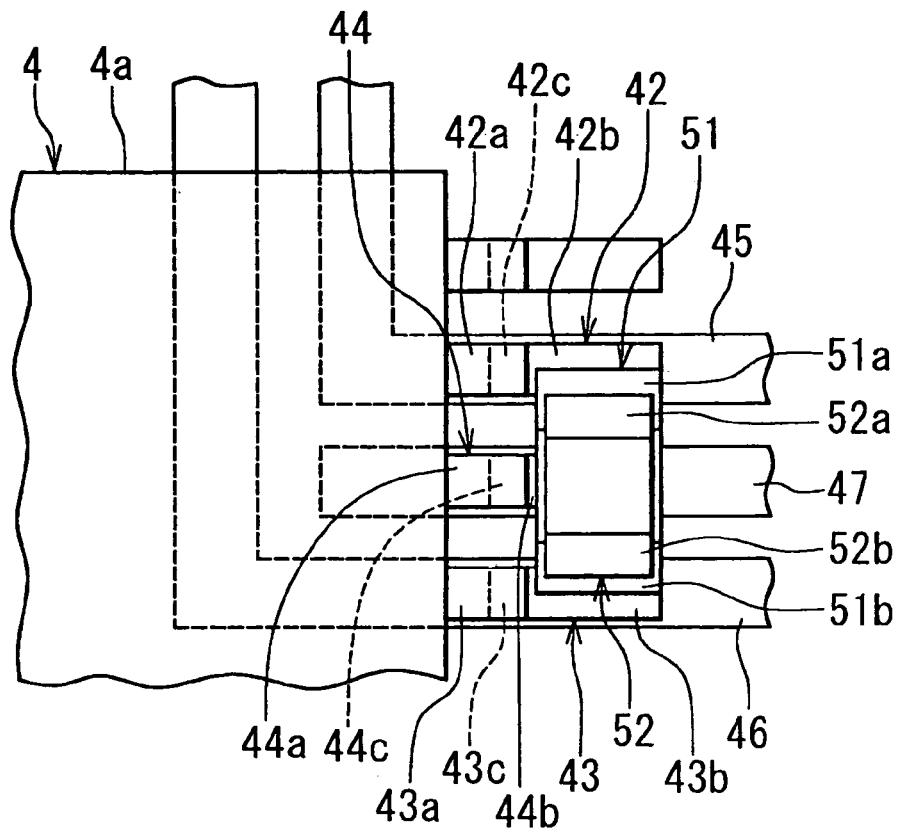
FIG. 8 is a schematic plan view showing a part of an IC for driving a laser diode and details in the vicinity thereof of a laser diode driving circuit which is another preferred embodiment of the present invention.
Figure 9:
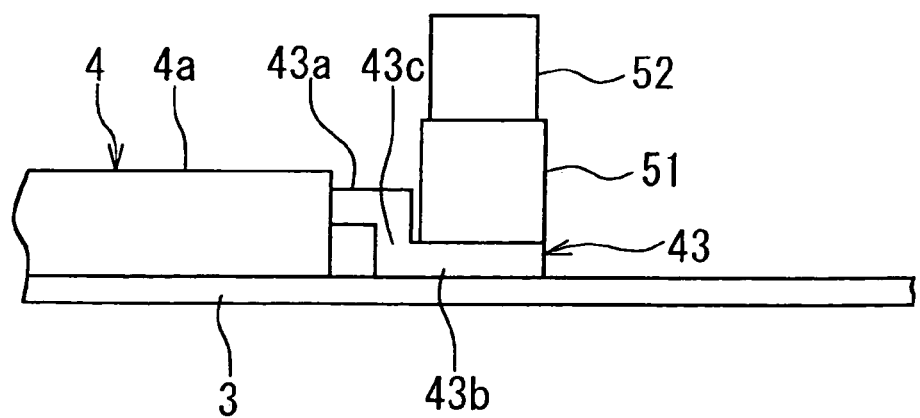
FIG. 9 is a schematic side view showing a part of an IC for driving a laser diode and details in the vicinity thereof of a laser diode driving circuit which is another preferred embodiment of the present invention.
Figure 10:
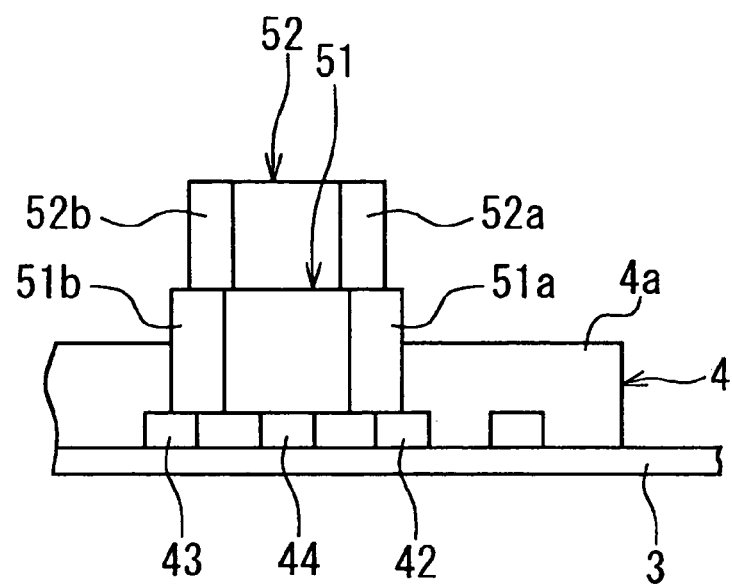
FIG. 10 is another schematic side view showing a part of an IC for driving a laser diode and details in the vicinity thereof of a laser diode driving circuit which is another preferred embodiment of the present invention.

FIG. 8 is a schematic plan view showing part of an IC for driving a laser diode and details in the vicinity thereof of a laser diode driving circuit which is another preferred embodiment of the present invention, FIG. 9 is a schematic side view showing part of the IC for driving a laser diode and details in the vicinity thereof of the laser diode driving circuit according to this embodiment and FIG. 10 is another schematic side view showing part of the IC for driving a laser diode and details in the vicinity thereof of the laser diode driving circuit according to this embodiment. Here, FIG. 9 is a view showing the IC for driving a laser diode of FIG. 8 viewed from the lower side and FIG. 10 is a view showing the IC for driving a laser diode of FIG. 8 viewed from the right side.

As shown in FIGS. 8 to 10, in this embodiment, the chip capacitors 51, 52 for removing a ripple component are disposed over the driving signal transmitting conductive section 47 and on the high voltage power supply terminal 42, the low voltage power supply terminal 43 and the driving signal output terminal 44. Concretely, the chip capacitor 51 is mounted on the board connecting portions 42b, 43b, 44b of the high voltage power supply terminal 42, the low voltage power supply terminal 43 and the driving signal output terminal 44 and the terminal portions 51a, 51b thereof are respectively connected to the board connecting portions 43b, 44b by solder, for example. On the other hand, the chip capacitor 52 is mounted on the chip capacitor 51 and the terminal portions 52a, 52b thereof are respectively connected to the terminal portions 51a, 51b of the chip capacitor 51 by solder, for example. Similarly to the embodiment shown in FIGS. 3 to 5, the chip capacitors 51, 52 are connected in parallel with each other.

Figure 11:
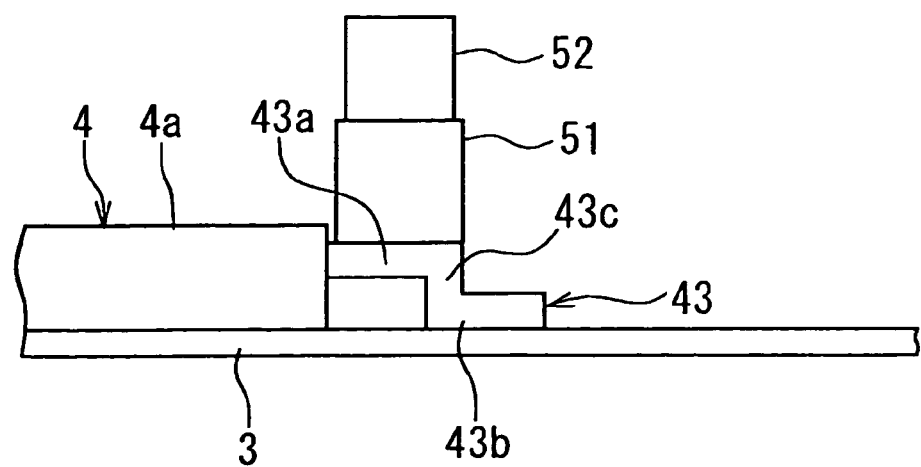
FIG. 11 is a schematic side view showing a part of an IC for driving a laser diode and details in the vicinity thereof of a laser diode driving circuit which is a further preferred embodiment of the present invention.

FIG. 11 is a schematic side view showing a part of an IC for driving a laser diode and details in the vicinity thereof of a laser diode driving circuit which is a further preferred embodiment of the present invention.

In this embodiment, the chip capacitor 51 is mounted on the main body connecting portions 42a, 43a, 44a of the high voltage power supply terminal 42, the low voltage power supply terminal 43 and the driving signal output terminal 44 and the terminal portions 51a, 51b thereof are respectively connected to the main body connecting portions 42a, 43a by solder, for example. On the other hand, the chip capacitor 52 is mounted on the chip capacitor 51 and the terminal portions 52a, 52b thereof are respectively connected to the terminal portions 51a, 51b of the chip capacitor 51 by solder, for example.

Other structural aspects of the laser diode driving circuit shown in FIGS. 8 to 10 or FIG. 11 are the same as those of the laser diode driving circuit shown in FIGS. 3 to 5. In each of the embodiments shown FIGS. 8 to 10 and FIG. 11, the chip capacitors 51, 52 are disposed closer to the switching element 41 in the IC 4 than in the embodiment shown FIGS. 3 to 5 and, therefore, pulsed light having a more ideal waveform can be generated.

In each of the embodiments shown FIGS. 8 to 10 and FIG. 11, it is not absolutely necessary to dispose the chip capacitors 51, 52 so as to be superposed and it is possible to dispose them in line on the high voltage power supply terminal 42, the low voltage power supply terminal 43 and the driving signal output terminal 44. Further, in each of the embodiments shown FIGS. 8 to 10 and FIG. 11, it is not absolutely necessary to provide two chip capacitors 51, 52 and it is possible to provide a single chip capacitor or three or more chip capacitors.

Figure 12:
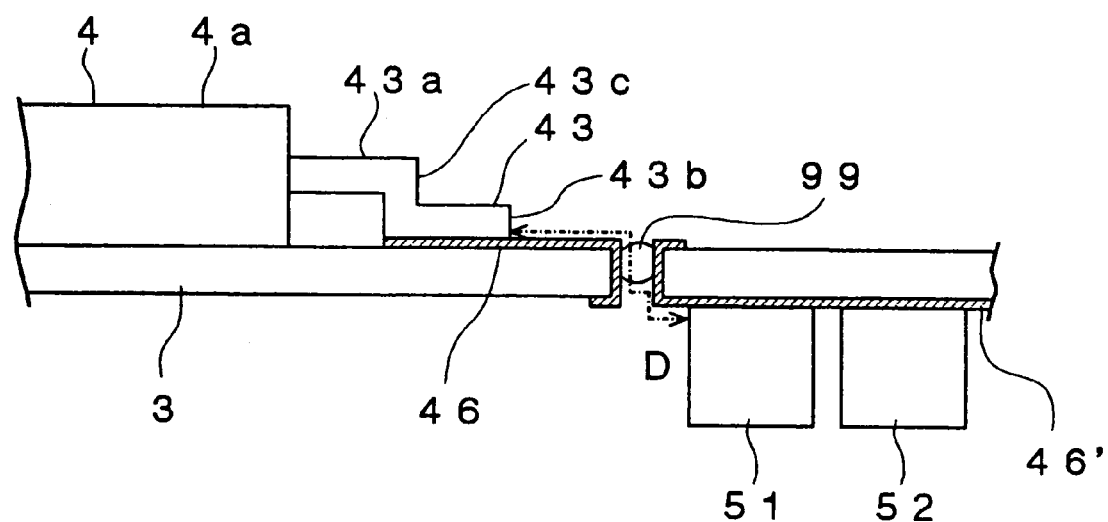
FIG. 12 is a schematic side view showing a part of an IC for driving a laser diode and details in the vicinity thereof of a laser diode driving circuit which is a still further preferred embodiment of the present invention.

FIG. 12 is a schematic side view showing part of an IC for driving a laser diode and details in the vicinity thereof of a laser diode driving circuit which is a still further preferred embodiment of the present invention.

In this embodiment, the chip capacitors 51, 52 are mounted on the surface of the flexible circuit board 3 opposite to the surface thereof on which the IC 4 is mounted. The high voltage conductive section 45 and the low voltage conductive section 46 of the flexible circuit board 3 connected to the high voltage power supply terminal 42 and the low voltage power supply terminal 43 are wired via throughholes to the reverse surface of the flexible circuit board 3.

More specifically, as shown in FIG. 12, the low voltage conductive section 46 connected to the low voltage power supply terminal 43 of the IC 4 extends to the reverse surface of the flexible circuit board 3 via a through-hole 99 and forms a low voltage conductive section 46' on the reverse surface of the flexible circuit board 3 and each of one end portions of the chip capacitors 51, 52 is connected to the low voltage conductive section 46'. Further, although not shown in FIG. 12, the high voltage conductive section 45 connected to the high voltage power supply terminal 42 of the IC 4 is wired to extend to the reverse surface of the flexible circuit board 3 via a through-hole and each of the other end portions of the tip capacitors 51, 52 is connected to the high voltage conductive section 45 formed on the reverse surface of the flexible circuit board 3.

In this embodiment, the distance D between the chip capacitor 51 disposed on the surface of the flexible circuit board 3 opposite to the surface thereof on which the IC 4 is mounted and each of the high voltage power supply terminal 42, the low voltage power supply terminal 43 and the driving signal output terminal 44, the distance D including the length of the through-hole 99, is preferably equal to or shorter than 10 mm and more preferably equal to or shorter than 5 mm. In the case where the distance D is equal to or shorter than 10 mm, when the clock frequency of pulsed light is 50 MHz, pulsed light having an ideal waveform free from a ripple component can be generated. Further, in the case where the distance D is equal to or shorter than 5 mm, not only when the clock frequency of pulsed light is 50 MHz, but also when the clock frequency of pulsed light is 25 MHz, pulsed light having an ideal waveform free from a ripple component can be generated.

WORKING EXAMPLES AND COMPARATIVE EXAMPLES

Hereinafter, working examples and comparative examples will be set out in order to further clarify the advantages of the present invention.

Working Example 1

As shown in FIG. 4, an optical head provided with a laser diode driving circuit in which two chip capacitors 51, 52 were mounted on board connecting portions 42b, 43b, 44b of a high voltage power supply terminal 42, a low voltage power supply terminal 43 and a driving signal output terminal 44 was fabricated.

One terminal portion of each of the chip capacitors 51 and 52 was connected to the board connecting portion 42b and the other terminal portion of each of the chip capacitors 51 and 52 was connected to the board connecting portion 43b.

The capacitance of the chip capacitor 51 was 10 µF and the capacitance of the chip capacitor 52 was 0.1 µF.

The distance D between the chip capacitor 51 and each of the high voltage power supply terminal 42, the low voltage power supply terminal 43 and the driving signal output terminal 44 was 10 mm.

The thus constituted laser diode driving circuit was operated to generate a driving signal that was a rectangular wave having a frequency of 25 MHz and the waveform thereof was observed using an oscilloscope.

Further, the laser diode driving circuit was caused to generate a driving signal that was a rectangular wave having a frequency of 50 MHz and the waveform thereof was observed using an oscilloscope.

Figure 13:
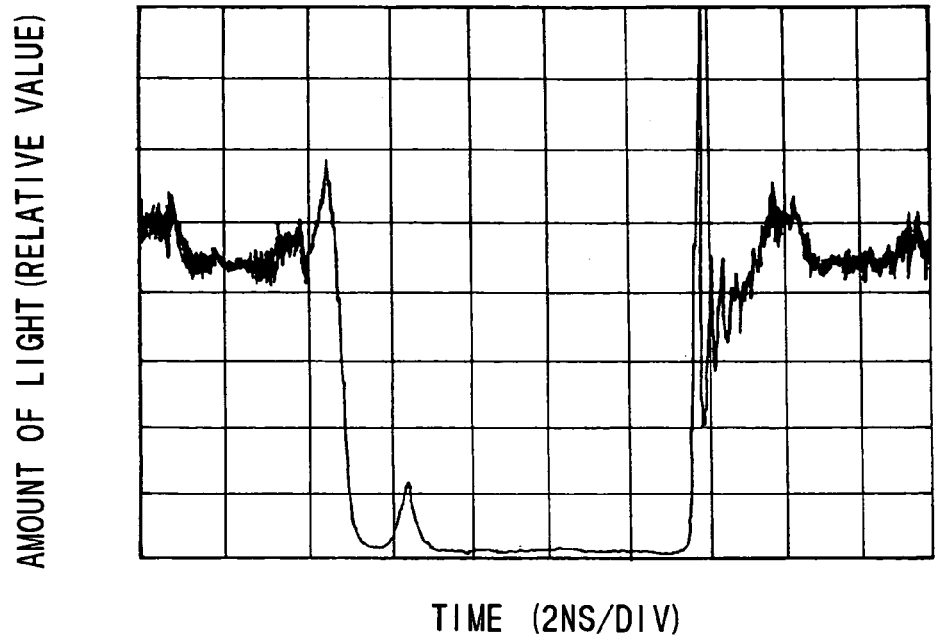
FIG. 13 is a diagram showing the waveform of a driving signal of 25 MHz generated by a laser diode driving circuit in which the distance between a capacitor and terminals is equal to 10 mm.
Figure 14:
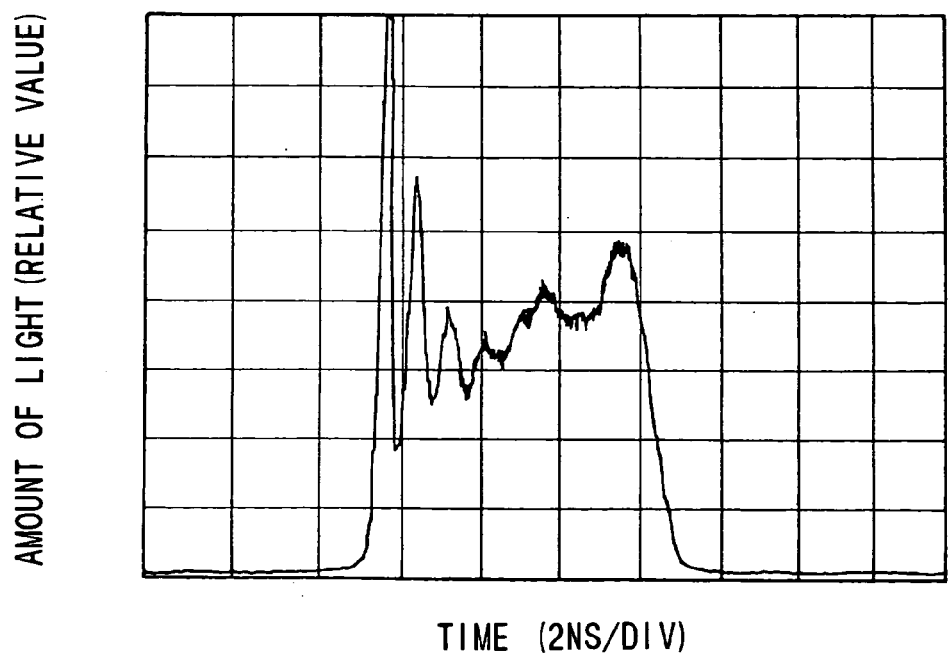
FIG. 14 is a diagram showing the waveform of a driving signal of 50 MHz generated by a laser diode driving circuit in which the distance between a capacitor and terminals is equal to 10 mm.

The results of the observation are shown in FIGS. 13 and 14.

FIG. 13 is a graph showing the waveform of the driving signal having a frequency of 25 MHz and FIG. 14 is a graph showing the waveform of the driving signal having a frequency of 50 MHz. In FIGS. 13 and 14, the abscissa axis indicates time and the ordinate axis indicates relative amount of light.

As shown in FIG. 13, it was found that although a slight ripple component was observed at the bottom portion of the rectangular waveform of the driving signal of 25 MHz, a driving signal having a generally good waveform was generated.

On the other hand, as shown in FIG. 14, it was found that although overshooting was observed at a rise portion of the waveform of the driving signal of 50 MHz, no ripple component was observed and a driving signal having an ideal waveform was generated.

Working Example 2

An optical head including a laser diode driving circuit was fabricated in a similar manner to Working Example 1 except that the distance D between the chip capacitor 51 and each of the high voltage power supply terminal 42, the low voltage power supply terminal 43 and the driving signal output terminal 44 was 5 mm.

The thus constituted laser diode driving circuit was operated to generate a driving signal that was a rectangular wave having a frequency of 25 MHz, a driving signal that was a rectangular wave having a frequency of 50 MHz and a driving signal that was a rectangular wave having a frequency of 100 MHz and the waveforms thereof were observed using an oscilloscope.

Figure 15:
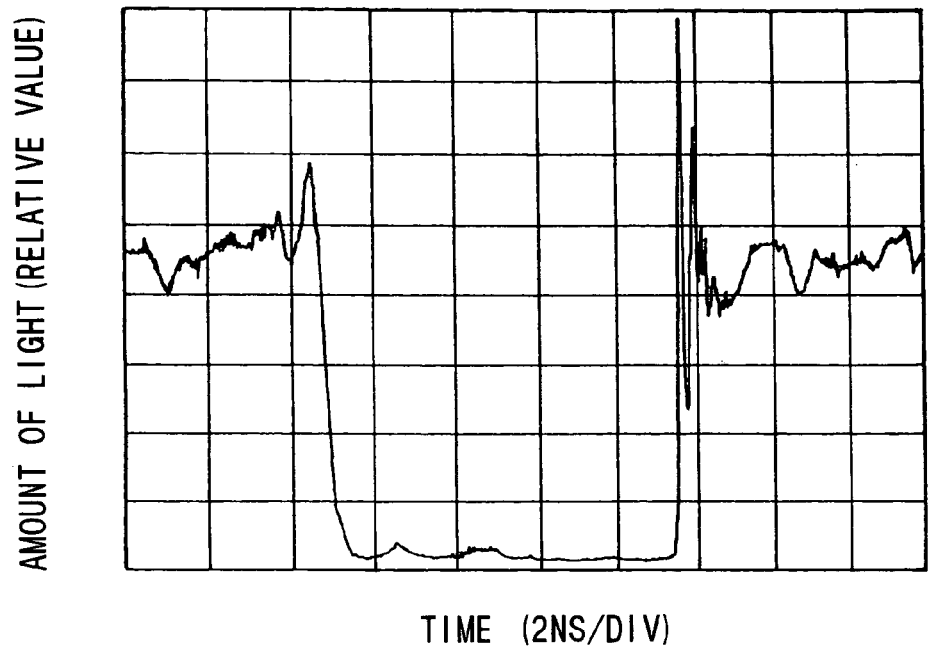
FIG. 15 is a diagram showing the waveform of a driving signal of 25 MHz generated by a laser diode driving circuit in which the distance between a capacitor and terminals is equal to 5 mm.
Figure 16:
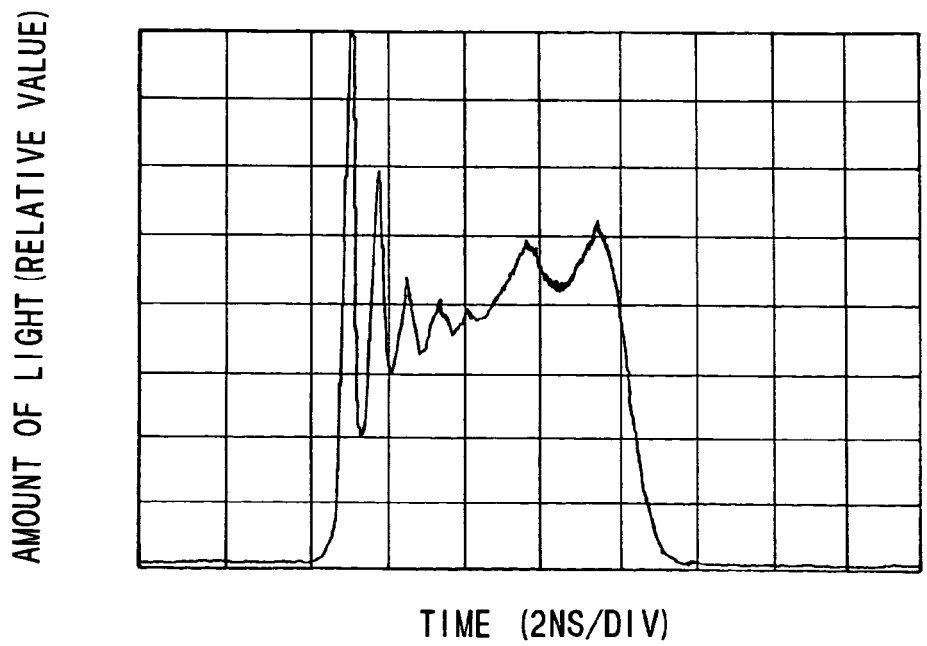
FIG. 16 is a diagram showing the waveform of a driving signal of 50 MHz generated by a laser diode driving circuit in which the distance between a capacitor and terminals is equal to 5 mm.
Figure 17:
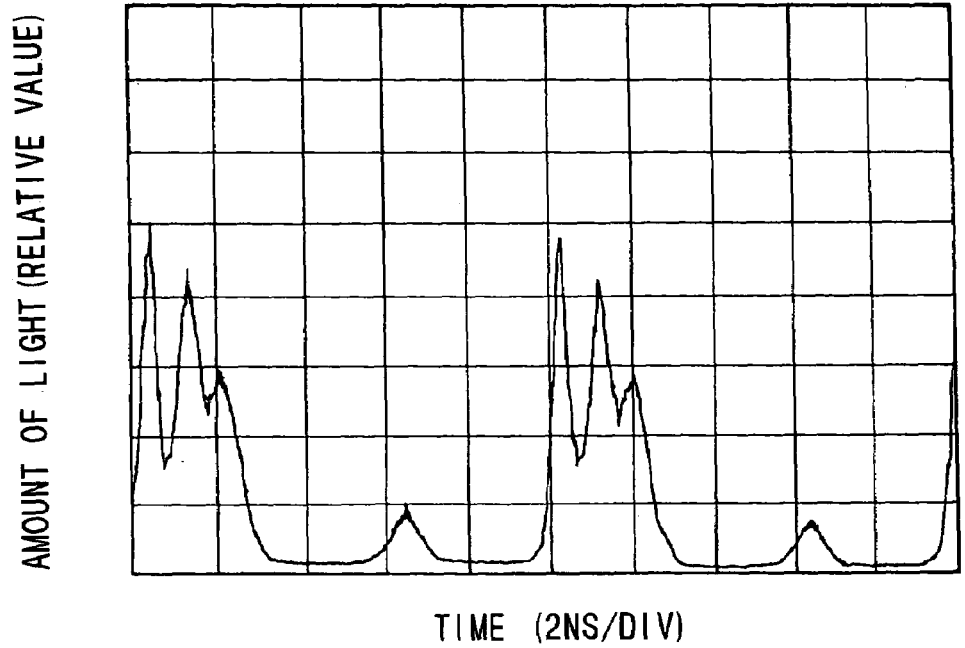
FIG. 17 is a diagram showing the waveform of a driving signal of 100 MHz generated by a laser diode driving circuit in which the distance between a capacitor and terminals is equal to 5 mm.

The results of the observation are shown in FIGS. 15 to 17.

FIG. 15 is a graph showing the waveform of the driving signal having a frequency of 25 MHz, FIG. 16 is a graph showing the waveform of the driving signal having a frequency of 50 MHz and FIG. 17 is a graph showing the waveform of the driving signal having a frequency of 100 MHz.

As shown in FIG. 15, no ripple component like that at the bottom portion of the rectangular waveform in Working Example 1 was observed in the driving signal of 25 MHz and a driving signal having an ideal waveform was generated.

Further, as shown in FIG. 16, it was found that although overshooting was observed at a rise portion of the waveform of the driving signal of 50 MHz, no ripple component was observed and a driving signal having an ideal waveform was generated.

Furthermore, as shown in FIG. 17, in the case of the driving signal of 100 MHz, it was found that a ripple component not observed in the waveforms of the driving signal having a frequency of 25 MHz and the driving signal having a frequency of 50 MHz was generated and large rounding was generated in the waveform thereof as a whole.

It is reasonable to consider that the ripple component of the power supply voltage could not be removed and the ripple component was generated because the total length of the closed circuit of the high frequency wave component consisting of the high voltage power supply terminal of the IC for driving the laser diode, the low voltage power supply terminal and the chip capacitor serving as a bypass capacitor was equal to or longer than 10 mm.

Therefore, it was found that in this Working Example no problem occurred when the frequency of the pulsed light was 50 MHz but that when the frequency of the pulsed light was 100 MHz, unnecessary pulses were generated in the waveform. It was therefore concluded that there was a risk of the recording performance of the optical head being degraded.

Working Example 3

An optical head including a laser diode driving circuit was fabricated in a similar manner to Working Example 1 except that the distance D between the chip capacitor 51 and each of the high voltage power supply terminal 42, the low voltage power supply terminal 43 and the driving signal output terminal 44 was 2 mm.

The thus constituted laser diode driving circuit was operated to generate a driving signal that was a rectangular wave having a frequency of 100 MHz, a driving signal that was a rectangular wave having a frequency of 200 MHz and a driving signal that was a rectangular wave having a frequency of 250 MHz and the waveforms thereof were observed using an oscilloscope.

Figure 18:
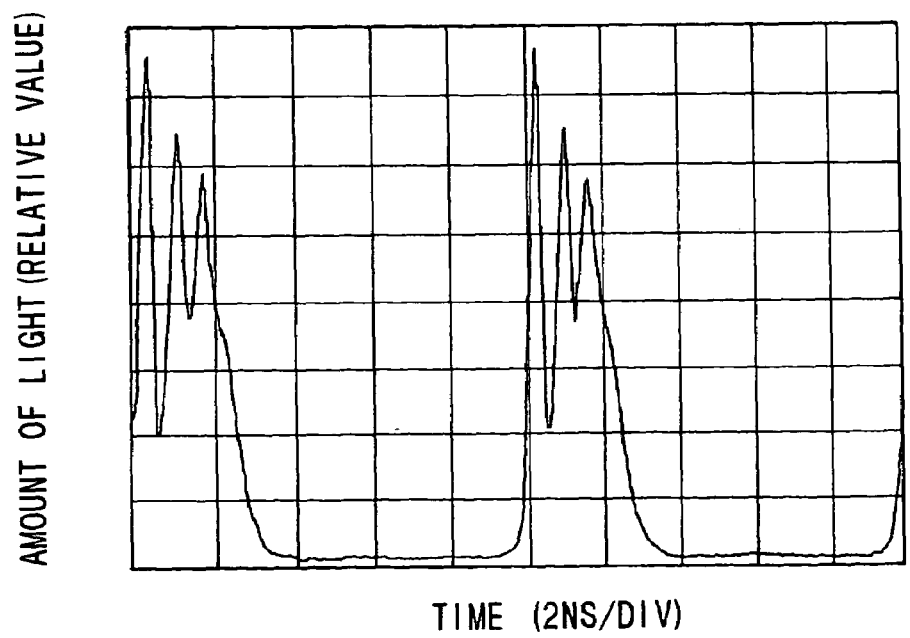
FIG. 18 is a diagram showing the waveform of a driving signal of 100 MHz generated by a laser diode driving circuit in which the distance between a capacitor and terminals is equal to 2 mm.
Figure 19:
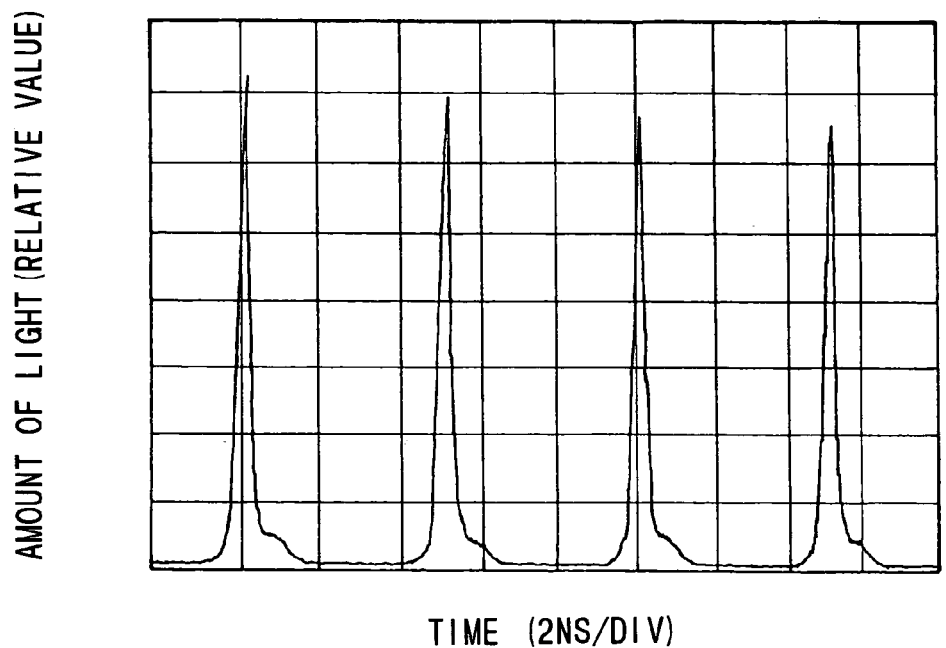
FIG. 19 is a diagram showing the waveform of a driving signal of 200 MHz generated by a laser diode driving circuit in which the distance between a capacitor and terminals is equal to 2 mm.
Figure 20:
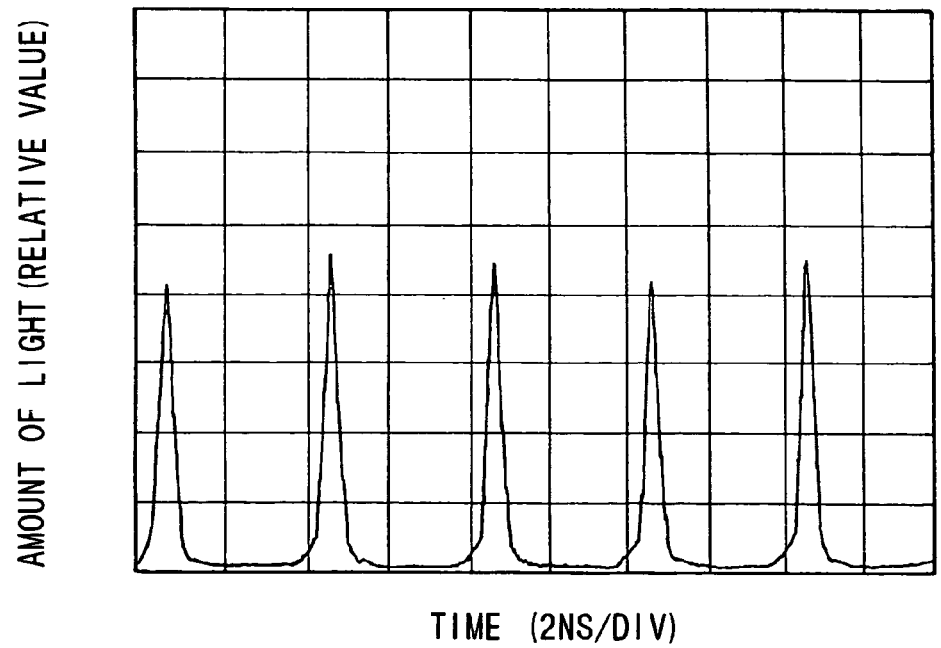
FIG. 20 is a diagram showing the waveform of a driving signal of 250 MHz generated by a laser diode driving circuit in which the distance between a capacitor and terminals is equal to 2 mm.

The results of the observation are shown in FIGS. 18 to 20.

FIG. 18 is a graph showing the waveform of the driving signal having a frequency of 100 MHz, FIG. 19 is a graph showing the waveform of the driving signal having a frequency of 200 MHz and FIG. 20 is a graph showing the waveform of the driving signal having a frequency of 250 MHz.

As shown in FIG. 18, it was found that although overshooting was observed at a rise portion of the waveform of the driving signal of 100 MHz, no ripple component was observed and a driving signal having an ideal waveform was generated.

On the other hand, as shown in FIG. 19, it was found that the driving signal generated at 200 MHz also had an ideal waveform composed of short pulses.

Further, as shown in FIG. 20, it was found that even the driving signal generated at 250 MHz had an ideal waveform composed of short pulses.

Comparative Example 1

An optical head including a laser diode driving circuit was fabricated in a similar manner to Working Example 1 except that the distance D between one chip capacitor 51 and each of the high voltage power supply terminal 42, the low voltage power supply terminal 43 and the driving signal output terminal 44 was 20 mm.

The thus constituted laser diode driving circuit was operated to generate a driving signal that was a rectangular wave having a frequency of 50 MHz and the waveform thereof was observed using an oscilloscope.

Figure 21:
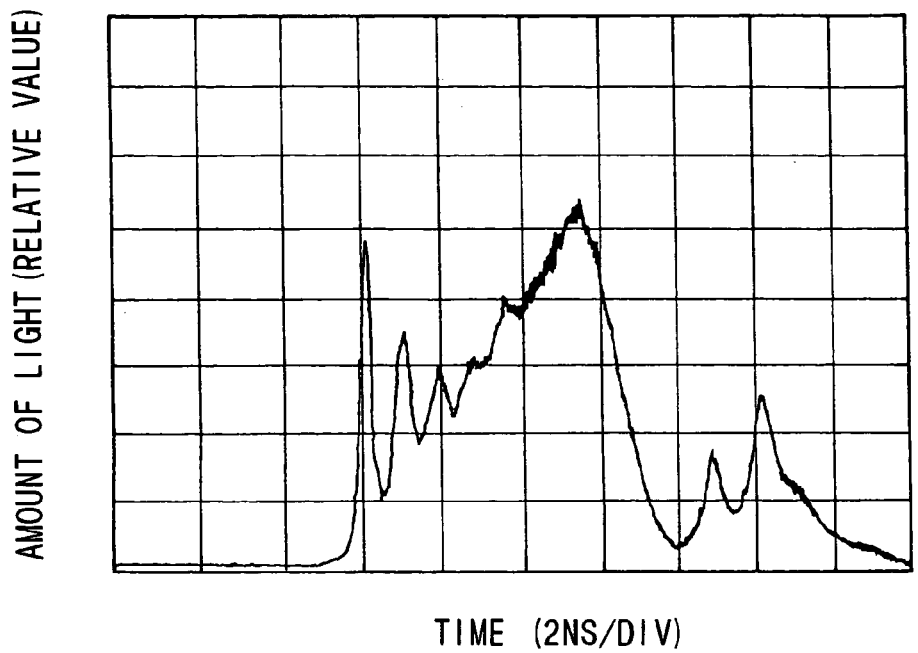
FIG. 21 is a diagram showing the waveform of a driving signal of 50 MHz generated by a laser diode driving circuit in which the distance between a capacitor and terminals is equal to 20 mm.

The results of the observation are shown in FIG. 21.

As shown in FIG. 21, it was found in the driving signal of 50 MHz that the rise and fall of the pulse was not sharp and a large ripple component was observed at a bottom portion of the pulse, whereby the waveform did not take the form of a rectangular pulse.

Comparative Example 2

An optical head including a laser diode driving circuit was fabricated in a similar manner to Working Example 1 except that the distance D between the chip capacitor 51 and each of the high voltage power supply terminal 42, the low voltage power supply terminal 43 and the driving signal output terminal 44 was 15 mm.

The thus constituted laser diode driving circuit was operated to generate a driving signal that was a rectangular wave having a frequency of 50 MHz and the waveform thereof was observed using an oscilloscope.

Figure 22:
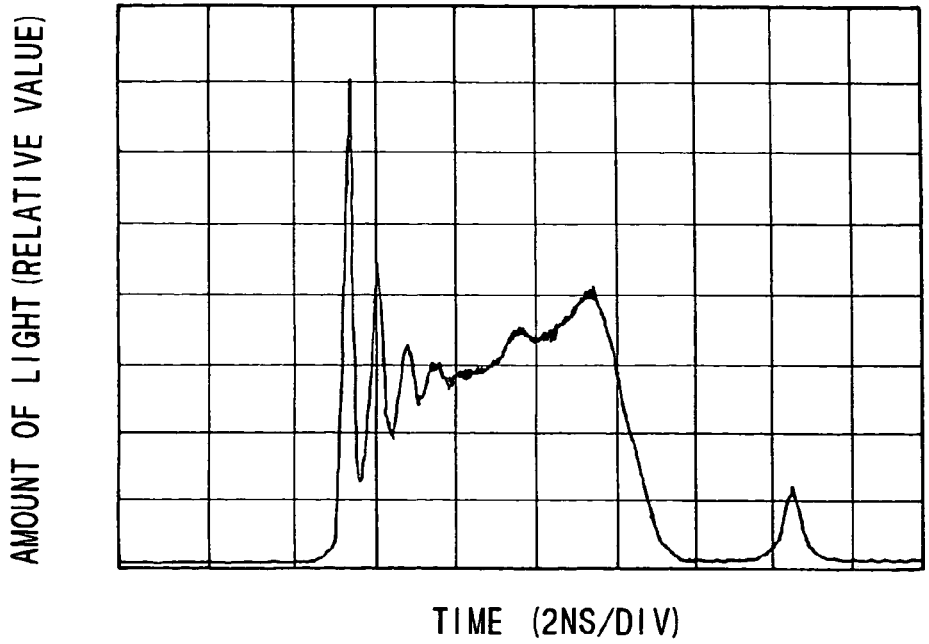
FIG. 22 is a diagram showing the waveform of a driving signal of 50 MHz generated by a laser diode driving circuit in which the distance between a capacitor and terminals is equal to 10 mm.
Figure 23:
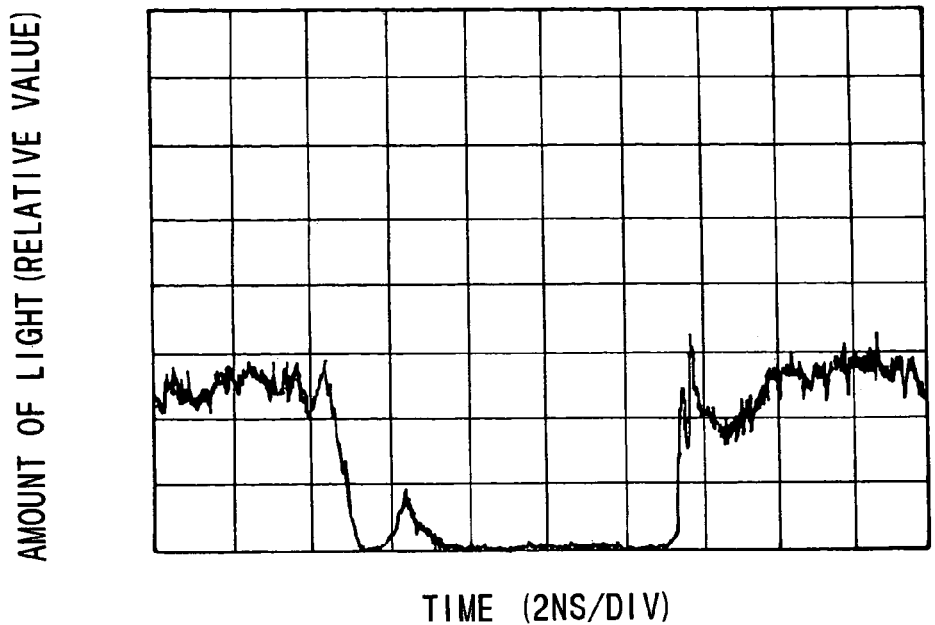
FIG. 23 is a diagram showing the waveform of a laser beam when the clock frequency of pulsed light is set to 25 MHz.
Figure 24:
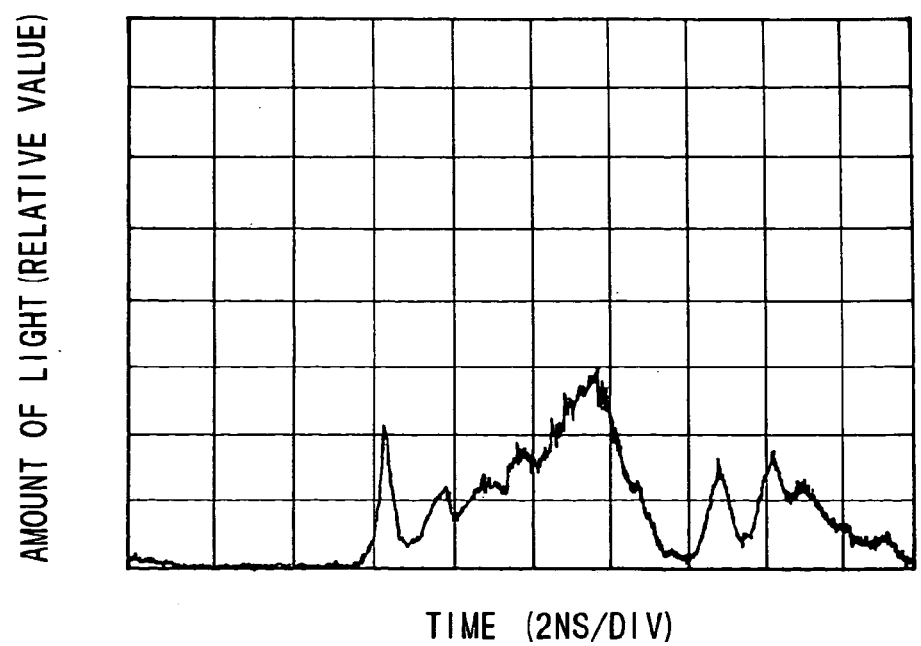
FIG. 24 is a diagram showing the waveform of a laser beam when the clock frequency of pulsed light is set to 50 MHz.

The results of the observation are shown in FIG. 22.

As shown in FIG. 22, it was found in the driving signal of 50 MHz that the rise and fall of the pulse was not sharp and a relatively large ripple component was observed at a bottom portion of the pulse, although it was not so large as that in Comparative Example 1.

From Working Examples 1 to 3 and Comparative Examples 1 and 2, it was found that in the case where pulsed light having a frequency of 50 MHz or higher was generated from a laser diode, it was preferable to dispose a chip capacitor serving as a bypass capacitor so that the distance between itself and the high voltage power supply terminal and the low voltage power supply terminal was equal to or shorter than 10 mm and more preferable to dispose it so that the distance between itself and the high voltage power supply terminal and the low voltage power supply terminal was equal to or shorter than 5 mm.

The present invention has thus been shown and described with reference to specific embodiments. However, it should be noted that the present invention is in no way limited to the details of the described arrangements but changes and modifications may be made without departing from the scope of the appended claims.

For example, in the above described embodiments, although the high voltage power supply terminal 42 and the low voltage power supply terminal 43 are disposed so that the driving signal output terminal 44 is positioned therebetween, it is not absolutely necessary to dispose the high voltage power supply terminal 42 and the low voltage power supply terminal 43 so that the driving signal output terminal 44 is positioned therebetween and the driving signal output terminal 44 may be disposed so as to be adjacent to either the high voltage power supply terminal 42 or the low voltage power supply terminal 43.

According to the present invention, it is possible to provide a laser diode driving circuit which can generate a good driving signal even when the pulse width of pulsed light emitted from a laser diode is narrow, an optical head including such a laser diode driving circuit, and a laser diode.

The invention claimed is:

1. A laser diode driving circuit comprising an integrated circuit for driving a laser diode, a capacitor disposed in the vicinity of the integrated circuit and a board on which the integrated circuit and the capacitor are mounted, the integrated circuit comprising a switching element for generating a driving signal for driving the laser diode, a high voltage power supply terminal and a low voltage power supply terminal for feeding a power supply voltage to the switching element and a driving signal output terminal for outputting a driving signal generated by the switching element to outside, the high voltage power supply terminal, the low voltage power supply terminal and the driving signal output terminal being disposed in line on one side of the integrated circuit, the board comprising a high voltage conductive section adapted for feeding a high voltage to the high voltage power supply terminal or connected to a ground level, a low voltage conductive section adapted for feeding a low voltage to the low voltage power supply terminal or connected to a ground level and a driving signal transmitting conductive section for connecting the driving signal output terminal and the laser diode and transmitting a driving signal to the laser diode, and the capacitor being connected to the high voltage power supply terminal at one terminal thereof and connected to the low voltage power supply terminal at the other terminal thereof, and being disposed so that a distance between itself and the high voltage power supply terminal, the low voltage power supply terminal and the driving signal output terminal is equal to or shorter than 10 mm.

2. A laser diode driving circuit in accordance with claim 1, wherein the capacitor includes two or more capacitor components whose capacitances are different from each other, each of the capacitor components is connected to the high voltage power supply terminal at one terminal thereof and connected to the low voltage power supply terminal at the other terminal thereof, and at least one capacitor component is disposed so that a distance between itself and the high voltage power supply terminal, the low voltage power supply terminal and the driving signal output terminal is equal to or shorter than 10 mm.

3. A laser diode driving circuit in accordance with claim 1, wherein the capacitor is mounted on a surface of the board opposite to a surface on which the integrated circuit is mounted and connected to the integrated circuit via a through-hole formed in the board.

4. A laser diode driving circuit in accordance with claim 2, wherein the capacitor is mounted on a surface of the board opposite to a surface on which the integrated circuit is mounted and connected to the integrated circuit via a through-hole formed in the board.

5. A laser diode driving circuit in accordance with claim 1, wherein the capacitor is disposed so that a distance between itself and the high voltage power supply terminal, the low voltage power supply terminal and the driving signal output terminal is equal to or shorter than 5 mm.

6. A laser diode driving circuit in accordance with claim 2, wherein the capacitor is disposed so that a distance between itself and the high voltage power supply terminal, the low voltage power supply terminal and the driving signal output terminal is equal to or shorter than 5 mm.

7. A laser diode driving circuit in accordance with claim 3, wherein the capacitor is disposed so that a distance between itself and the high voltage power supply terminal, the low voltage power supply terminal and the driving signal output terminal is equal to or shorter than 5 mm.

8. A laser diode driving circuit in accordance with claim 4, wherein the capacitor is disposed so that a distance between itself and the high voltage power supply terminal, the low voltage power supply terminal and the driving signal output terminal is equal to or shorter than 5 mm.

9. An optical head comprising a laser diode driving circuit, a laser diode driven by the laser diode driving circuit and an optical system for projecting a laser beam emitted from the laser diode on an optical recording medium, the laser diode driving circuit comprising an integrated circuit for driving a laser diode, a capacitor disposed in the vicinity of the integrated circuit and a board on which the integrated circuit and the capacitor are mounted, the integrated circuit comprising a switching element for generating a driving signal for driving the laser diode, a high voltage power supply terminal and a low voltage power supply terminal for feeding a power supply voltage to the switching element and a driving signal output terminal for outputting a driving signal generated by the switching element to outside, the high voltage power supply terminal, the low voltage power supply terminal and the driving signal output terminal being disposed in line on one side of the integrated circuit, the board comprising a high voltage conductive section adapted for feeding a high voltage to the high voltage power supply terminal or connected to a ground level, a low voltage conductive section adapted for feeding a low voltage to the low voltage power supply terminal or connected to a ground level and a driving signal transmitting conductive section for connecting the driving signal output terminal and the laser diode and transmitting a driving signal to the laser diode, and the capacitor being connected to the high voltage power supply terminal at one terminal thereof and connected to the low voltage power supply terminal at the other terminal thereof, and being disposed so that a distance between itself and the high voltage power supply terminal, the low voltage power supply terminal and the driving signal output terminal is equal to or shorter than 10 mm.

10. An optical head in accordance with claim 9, wherein the capacitor includes two or more capacitor components whose capacitances are different from each other, each of the capacitor components is connected to the high voltage power supply terminal at one terminal thereof and connected to the low voltage power supply terminal at the other terminal thereof, and at least one capacitor component is disposed so that a distance between itself and the high voltage power supply terminal, the low voltage power supply terminal and the driving signal output terminal is equal to or shorter than 10 mm.

11. An optical head in accordance with claim 9, wherein the capacitor is mounted on a surface of the board opposite to a surface on which the integrated circuit is mounted and connected to the integrated circuit via a through-hole formed in the board.

12. An optical head in accordance with claim 10, wherein the capacitor is mounted on a surface of the board opposite to a surface on which the integrated circuit is mounted and connected to the integrated circuit via a through-hole formed in the board.

13. An optical head in accordance with claim 9, wherein the capacitor is disposed so that a distance between itself and the high voltage power supply terminal, the low voltage power supply terminal and the driving signal output terminal is equal to or shorter than 5 mm.

14. An optical head in accordance with claim 10, wherein the capacitor is disposed so that a distance between itself and the high voltage power supply terminal, the low voltage power supply terminal and the driving signal output terminal is equal to or shorter than 5 mm.

15. An optical head in accordance with claim 11, wherein the capacitor is disposed so that a distance between itself and the high voltage power supply terminal, the low voltage power supply terminal and the driving signal output terminal is equal to or shorter than 5 mm.

16. An optical head in accordance with claim 12, wherein the capacitor is disposed so that a distance between itself and the high voltage power supply terminal, the low voltage power supply terminal and the driving signal output terminal is equal to or shorter than 5 mm.

* * * * *